United States Patent
Noda et al.

(10) Patent No.: US 8,178,428 B2
(45) Date of Patent: May 15, 2012

(54) MANUFACTURING METHOD OF SEMICONDUCTOR DEVICE AND SUBSTRATE PROCESSING APPARATUS

(75) Inventors: Takaaki Noda, Toyama (JP); Jie Wang, Toyama (JP); Kazuaki Tonari, Tokyo (JP); Satoru Sugiyama, Tokyo (JP)

(73) Assignees: Hitachi Kokusai Electric Inc., Tokyo (JP); Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/656,415

(22) Filed: Jan. 28, 2010

(65) Prior Publication Data
US 2010/0317174 A1   Dec. 16, 2010

(30) Foreign Application Priority Data
Jan. 28, 2009   (JP) ................ 2009-016436

(51) Int. Cl.
*H01L 21/20* (2006.01)
(52) U.S. Cl. ............. 438/488; 438/764; 257/E21.297
(58) Field of Classification Search .......... 438/489, 438/491, 532, 764; 257/E21.297
See application file for complete search history.

(56) References Cited

U.S. PATENT DOCUMENTS

| | | | |
|---|---|---|---|
| 5,545,500 A * | 8/1996 | Shirai et al. ............. 430/67 |
| 2003/0119288 A1 | 6/2003 | Yamazaki et al. |
| 2003/0164528 A1 | 9/2003 | Rhee et al. |
| 2004/0012055 A1 | 1/2004 | Rhee et al. |
| 2005/0252443 A1* | 11/2005 | Tsai et al. ............. 117/84 |
| 2007/0126034 A1 | 6/2007 | Sakai et al. |
| 2007/0181972 A1* | 8/2007 | Voldman ............. 257/532 |

FOREIGN PATENT DOCUMENTS

| | | |
|---|---|---|
| JP | A-2003-77845 | 3/2003 |
| JP | A-2003-282877 | 10/2003 |
| KR | A-10-2006-0083218 | 7/2006 |

* cited by examiner

*Primary Examiner* — Cheung Lee
(74) *Attorney, Agent, or Firm* — Oliff & Berridge, PLC

(57) ABSTRACT

A manufacturing method of a semiconductor device is provided, comprising: loading a substrate into a processing chamber; forming a first film on the substrate by supplying silicon atom-containing gas, boron atom-containing gas, and germanium atom-containing gas into the processing chamber; forming a second film on the first film by supplying the silicon atom-containing gas and the boron atom-containing gas into the processing chamber; and unloading the substrate from the processing chamber.

20 Claims, 11 Drawing Sheets

MANUFACTURING METHOD OF SEMICONDUCTOR DEVICE AND SUBSTRATE PROCESSING APPARATUS

TECHNICAL FIELD

The present invention relates to a manufacturing method of a semiconductor device including the step of processing a substrate and a substrate processing apparatus, and particularly relates to the manufacturing method of the semiconductor device including the step of forming a boron doped silicon germanium film on the substrate and the substrate processing apparatus.

DESCRIPTION OF RELATED ART

In the step of manufacturing a semiconductor device such as IC and LSI, a film is formed on a substrate, for example, by using a vertical vacuum CVD apparatus, based on a vacuum CVD method (chemical vapor deposition method).

For example, when the boron doped silicon germanium film is formed on the substrate, by using such a CVD apparatus, there is a problem that it is difficult to control a film thickness and resistivity of a boron doped silicon germanium film.

Further, a bonding strength between a film excessively containing germanium atoms and a metal film is weakened and therefore there is a problem that productivity is deteriorated (production yield is deteriorated) when a device is manufactured, and simultaneously there is a request to suppress a use amount of germanium raw materials, due to expensive germanium raw materials.

In order to solve the above-described problem, an object of the present invention is to provide a manufacturing method of a semiconductor device and a substrate processing apparatus, capable of suppressing the use amount of the germanium raw materials and strengthening the bonding strength between the film containing excessive amount of germanium atoms and the metal film, and improving the productivity.

SUMMARY OF THE INVENTION

According to an aspect of the present invention, there is provided a manufacturing method of a semiconductor device comprising:

loading a substrate into a processing chamber;

forming a first film on the substrate by supplying silicon atom-containing gas, boron atom-containing gas, and germanium atom-containing gas into the processing chamber;

forming a second film on the first film by supplying the silicon atom-containing gas and the boron atom-containing gas into the processing chamber; and unloading the substrate from the processing chamber.

According to another aspect of the present invention, there is provided a substrate processing apparatus, comprising:

a processing chamber for processing a substrate;

a silicon atom-containing gas supply system for supplying the silicon atom-containing gas into the processing chamber;

a boron atom-containing gas supply system for supplying the boron atom-containing gas into the processing chamber;

a germanium atom-containing gas supply system for supplying the germanium atom-containing gas into the processing chamber; and a controller for controlling the silicon atom-containing gas supply system, the boron atom-containing gas supply system, and the germanium atom-containing gas supply system, so that the silicon atom-containing gas, the boron atom-containing gas, and the germanium atom-containing gas are supplied into the processing chamber, to thereby form a first film on the substrate, and the silicon atom-containing gas and the boron atom-containing gas are supplied into the processing chamber, to thereby form a second film on the first film, under changeable film forming conditions of the first film and the second film.

DESCRIPTION OF PREFERRED EMBODIMENTS OF THE INVENTION

According to the manufacturing method of the semiconductor device and the substrate processing apparatus of the present invention, the use amount of the germanium atoms can be suppressed, and a problem of bonding with the metal film cam be solved. Further, a film thickness and resistivity among continuous batches can be stabilized.

First Embodiment

A first embodiment of the present invention will be described based on the drawings.

FIG. 1 is vertical sectional view of a schematic block diagram of a reaction furnace 12 of a batch type vertical vacuum CVD apparatus, being a substrate processing apparatus suitably used in the first embodiment of the present invention.

In this vacuum CVD apparatus, gas is introduced from a lower part of a reaction furnace to be vertically drifted upward, in a state of stacking and supporting vertically a plurality of wafers on boats, being supporting tools in the reaction furnace, by using silicon atom-containing gas such as monosilane ($SiH_4$)(hereinafter, also simply called silane ($SiH_4$)) and boron atom-containing gas such as boron trichloride ($BCl_3$) gas, and germanium atom-containing gas such as monogermane ($GeH_4$) (hereinafter, also simply called germane ($GeH_4$)) gas, and by using the gas and using a thermal CVD method, a boron doped silicon germanium film such as a boron doped polysilicon germanium film is formed as a first film on a wafer, and a boron doped silicon film such as a boron doped polysilicon film is formed on the first film as a second film, and a resistance film is formed by the first film and the second film.

As shown in FIG. 1, a reaction tube made of quartz, namely an outer tube 1, being an outer cylinder of a reaction furnace 12, is installed concentrically with heaters 6 with tube axis set vertically, inside of a heater 6 (6a to 6d) as a heating mechanism (heating means) which is divided into four zones and which constitutes a hot-wall furnace to heat wafers 4 as substrates. A reaction tube made of quartz or SiC, namely, an inner tube 2, being an inner cylinder of the reaction furnace 12, is installed inside of the outer tube 1 concentrically with the outer tube 1, with the tube axis set vertically. A processing chamber 1a is formed in the outer tube 1 and the inner tube 2. Space between these two kinds of tubes is set in a vacuumizable state by using a mechanical booster pump (MBP) 7 and a dry pump (DP) 8 as a vacuum exhaust system. Accordingly, reaction gas introduced into the inner tube 2 drifts upward vertically in the inner tube 2, then comes down between the two kinds of tubes, and is exhausted.

A stainless manifold (inlet adapter) 15 is installed in a lower part of the outer tube 1, concentrically with the outer tube 1. The manifold 15 is fitted into the inner tube 2 and the outer tube 1, and is provided so as to support them. Further, an O-ring 11b, being a seal member, is provided between the manifold 15 and the outer tube 1. A reaction vessel is formed by the outer tube 1, the inner tube 2, and the manifold 15.

The boats 3 made of quartz or SiC, as supporting tools in which a plurality of wafers 4 are charged, are accommodated in the inner tube 2 as shown in FIG. 1, when the wafers 4 are processed. When the wafers 4 are exposed to the reaction gas, a film is formed on the wafers 4 by reaction in a vapor phase and on the surfaces of the wafers 4. A plurality of heat insulating plates 5 charged in an area below an area where the plurality of wafers 4 of the boat 3 are charged, function to make temperature uniform in a wafer arrangement area where the wafers 4 exist.

Further, in FIG. 1, "10" indicates a boat rotary shaft, which is passed through a stainless lid (seal cap) 11 and is connected to a rotation mechanism 17. Further, the lid 11 is connected to a boat elevator 18 as a loading/unloading apparatus (elevation apparatus).

The boats 3, the rotary shaft 10, the lid 11, and the rotation mechanism 17 are integrally elevated by the boat elevator 18, so that the boats 3 are loaded into the reaction furnace 12 (into the processing chamber 1a), or unloaded from the reaction furnace 12. The lid 11 air-tightly closes an inside of the reaction furnace 12 in close contact with the manifold 15, through the O-ring 11a as a sealing member, in a state that the boats 3 are loaded into the reaction furnace 12. Further, the boats 3 are rotated in the reaction furnace 12 by the rotation mechanism 17 through the rotary shaft 10.

Further, a plurality of slots for supporting the wafers 4, for example, 100 to 200 slots are formed on the boats 3. A lower dummy area D1 is formed up to 5-10 slots counted from a lowest slot, and a dummy wafer 4 is supported by the slot belonging to the lower dummy area D1. Moreover, an upper dummy area D2 is formed up to, for example, 5-10 slots counted from an uppermost slot, and a dummy wafer 4 is supported by the slot belonging to the upper dummy area D2. Further, an area between the lower dummy area D1 and the upper dummy area D2 is a product wafer area P, and a product wafer 4 is supported by the slot belonging to this product wafer area P. Moreover, a plurality of slots for supporting a plurality of heat insulating plates 5 are formed below wafer arrangement areas (D2, P, D1) of the boats 3, and the heat insulating plate 5 is disposed on a lower side of the heater 6d corresponding to an L-zone of the heater zone divided into four as will be described later. Further, top area T, center area C, bottom area B in FIG. 1 indicate an upper area, a center area, and a bottom area in the product wafer area P, respectively.

Further, a lowermost L (Lower) zone (corresponding to heater 6d) of the heater zone of the heater 6 divided into four, corresponds to an area where only the lower dummy wafer 4 exists and the product wafer 4 does not exist, and a second lowest CL (Center Lower) zone (corresponding to heater 6c) corresponds to an area where the lower dummy wafer 4 and the product wafer 4 coexist, and third lowest, namely, second uppermost CU (Center Upper) zone (corresponding to heater 6b) corresponds to an area where the product wafer 4 and the upper dummy wafer 4 coexist, and a fourth lowest, namely, an uppermost U (Upper) zone (corresponding to heater 6a) corresponds to an area where the product wafer 4 and the dummy wafer 4 do not coexist.

A plurality of nozzles 13 with different lengths for supplying monosilane ($SiH_4$) gas, being silicon atom (Si) containing gas, are formed inside of the reaction furnace 12, each of them being attached to the manifold 15 so as to pass through the manifold 15. A plurality of nozzles 13, five nozzles in total here, are formed, and a nozzle (short nozzle) 13a, being one of them, is formed below an area facing the heater and an area facing the manifold 15 at a lower part of the reaction tube. The other four nozzles (long nozzle) 13b is formed in an area where at least a part of them faces the heater 6, at a position where each gas jet port (tip part) is not overlapped vertically, at equal interval here, so that $SiH_4$ gas can be supplied in the middle from a plurality of parts in a vertical direction in the processing chamber 1a. Note that the nozzle 13a is opened so that the gas jet port is directed to a horizontal direction, in such a manner as jetting the $SiH_4$ gas in a direction parallel to a wafer surface, namely, in a horizontal direction. Moreover, the nozzle 13b is opened so that the gas jet port is directed upward in the vertical direction, in such a manner as jetting the $SiH_4$ gas in a direction vertical to the wafer surface, namely, in the vertical direction. Five nozzles 13 are connected to five branched gas lines 20. The gas lines 20 are connected to a monosilane ($SiH_4$) gas source 23 through a mass flow controller 21 and a valve 22, being a flow rate controller (flow rate control means). With this structure, supply flow rate, concentration, and partial pressure of the $SiH_4$ gas can be controlled at each position in the processing chamber 1a. A silicon atom-containing gas supply system as a gas supply system is mainly constituted of the monosilane gas source 23, valve 22, mass flow controller 21, gas lines 20, and nozzles 13.

Nozzles 14 for supplying boron trichloride ($BCl_3$), being boron atom (B) containing gas are made of, for example, quartz, and a plurality of nozzles 14 with different lengths are provided in the reaction furnace 12, each of them being attached to the manifold 15 so as to pass through the manifold 15. A plurality of nozzles 14, five nozzles here, are formed, and a nozzle (short nozzle) 14a, being one of them, is formed below the area facing the heater and the area facing the manifold 15 at a lower part of the reaction tube. The other four nozzles (long nozzle) 14b are formed in an area where at least a part of them faces the heater 6, at a position where each gas jet port (tip part) is not overlapped vertically, at equal interval here, so that $BCl_3$ gas can be supplied in the middle from a plurality of parts in a vertical direction in the processing chamber 1a. Note that the nozzle 14a is opened so that the gas jet port is directed to a horizontal direction, in such a manner as jetting the $BCl_3$ gas in a direction parallel to a wafer surface, namely, in a horizontal direction. Moreover, the nozzle 14b is opened so that the gas jet port is directed upward in the vertical direction, in such a manner as jetting the $BCl_3$ gas in a direction vertical to the wafer surface, namely, in the vertical direction. Further, the nozzles 14a, 14b for supplying $BCl_3$ gas and the nozzles 13a, 13b for supplying $SiH_4$ gas have the same shapes respectively, and the gas jet ports (tip parts) of the nozzles 14a, 14b and the gas jet ports (tip parts) of the nozzles 13a, 13b are arranged at the same position (same height) respectively in the vertical direction. Five nozzles 14 are connected to five branched gas lines 27. The gas lines 27 are connected to a boron trichloride ($BCl_3$) gas source 30 through a mass flow controller 28 and a valve 29, being a flow rate controller (flow rate control means). With this structure, supply flow rate, concentration, and partial pressure of the $BCl_3$ gas can be controlled at each position in the processing chamber 1a. A boron atom-containing gas supply system as a gas supply system is mainly constituted of the boron trichloride ($BCl_3$) gas source 30, valve 29, mass flow controller 28, gas lines 27, and nozzles 14.

The nozzle 13 for supplying the monogermane ($GeH_4$) gas, being the germanium atom-containing (Ge) gas, is used in common with the nozzle 13 for supplying the monosilane ($SiH_4$) gas, being the silicon atom-containing gas. Five nozzles 13 are respectively connected to five branched gas lines 51 through five branched gas lines 20. The gas lines 51 are connected to a monogermane ($GeH_4$) gas source 54 through mass flow controllers 52, being the flow rate controllers (flow rate control means) and a valve 53. With this structure, supply flow rate, concentration, and partial pressure of the $GeH_4$ gas can be controlled at each position in the processing chamber 1a. A germanium atom-containing gas supply system as a gas supply system is mainly constituted of the monogermane gas source 54, valve 53, mass flow controllers 52, gas lines 51, and nozzles 13.

The aforementioned mechanical booster pump 7 and the dry pump 8 are provided to an exhaust tube 16 with one end connected to the manifold 15. Further, a pressure sensor 19, being a pressure detector, and a main valve 9 are provided to the exhaust tube 16. An APC (automatic pressure control) valve is used in this main valve 9, and based on a pressure detected by the pressure sensor 19, an opening degree of a valve is automatically adjusted so that the pressure in the reaction furnace 12 is set to a prescribed value.

Note that control of the operation of each part constituting the substrate processing apparatus, such as heater 6 (6a to 6d), main valve 9, mechanical booster pump 7, dry pump 8, mass flow controllers 21, 24, 28, 42, valves 22, 25, 29, 43, boat elevator 18, and rotation mechanism 17, is performed by a controller 31, being a control part (control means).

Next, by using the substrate processing apparatus and as one step of the manufacturing steps of the semiconductor device, explanation will be given for a film forming method of forming a boron doped silicon germanium film on the substrate as a first film having large germanium atomic ratio in the film, and on the first film, forming a boron doped silicon film as a second film, and forming a resistance film by the first film and the second film. A film formation procedure is shown in FIG. 2. Note that in the explanation given hereinafter, the operation of each part constituting the substrate processing apparatus is controlled by the controller 31.

First, a loading step will be described. In step S10, a plurality of wafers 4 are charged into the boats 3, and in step S12, temperature in a reactor, namely a reaction furnace 12, is stabilized to a prescribed temperature, and thereafter in step S14, each boat 3 charged with wafer 4 is loaded into the reaction furnace 12, namely into the processing chamber 1a. Next, in step S16, exhaust of an inside of the processing chamber 1a is started, and in step S18, nitrogen ($N_2$) gas purge is performed, so that moisture adsorbed on the boat 3 and the tube 12 is desorbed. Namely, the inside of the processing chamber 1a is exhausted from the exhaust tube 16 while supplying $N_2$ gas into the processing chamber 1a from a nozzle 40.

Next, the step of forming the resistance film having a prescribed film thickness will be described. The resistance film is formed in such a manner that the first film is formed in the first film forming step and thereafter the second film is formed in the second film forming step.

First, the first film forming step will be described. In step S20, in order to form the first film, the gas mass follow controller 21, the mass flow controller 28, and the mass flow controller 52 are set so that supply flow rates of the $SiH_4$ gas, the $BCl_3$ gas, and the $GeH_4$ gas are set to have a prescribed gas ratio respectively, then the inside of the processing chamber 1a is exhausted from the exhaust tube 16 while supplying the $SiH_4$ gas, the $BCl_3$ gas, and the $GeH_4$ gas into the processing chamber 1a from the nozzles 13 and the nozzles 14, to stabilize the pressure in the processing chamber 1a, and in step S22, the boron doped silicon germanium film, namely, the boron doped polysilicon germanium film is formed on the wafer 4 as the first film by the thermal CVD method. When the film thickness of the first film reaches a prescribed film thickness, the first film forming step is completed.

Subsequently, the second film forming step will be described. After the first film forming step is completed, in order to form the second film on the first film, in step S24, the gas mass flow controller 21 and the mass flow controller 28 are set so that the supply flow rates of the $SiH_4$ gas and the $BCl_3$ gas are set to a prescribed gas ratio respectively, while supply of the $GeH_4$ gas is stopped by setting the mass flow controller 52, and the inside of the processing chamber 1a is exhausted from the exhaust tube 16 while supplying the $SiH_4$ gas and the $BCl_3$ gas respectively into the processing chamber 1a from the nozzles 13 and the nozzles 14, to stabilize the pressure in the processing chamber 1a, and the boron doped silicon film, namely the boron doped polysilicon film is formed on the first film as the second film by the thermal CVD method. When the film thickness of the resistance film formed by the first film and the second film reaches a prescribed film thickness, the second film forming step is completed.

Poly-crystallization of the first film is accelerated by forming a film having a large germanium atomic ratio in the film, and the second film formed on the first film can also be poly-crystallized in accordance with the first film. Therefore, according to a conventional technique, processing at processing temperature 500° C. or less is necessary for poly-crystallizing the film. However, poly-crystallization is possible at processing temperature of 480° C. or less, being a further low temperature condition, while suppressing the use amount of the germanium raw material. Further, conventionally a grain size of a germanium atom is large, and therefore if germanium atoms exist excessively in the film, for example, like a boron silicon germanium single film, great irregularities are generated on the surface of the poly-crystallized film, and the bonding strength between the formed film and a metal film formed thereon is weakened, thus involving a problem that productivity of a device is deteriorated (production yield is deteriorated). However, according to this embodiment, the germanium atomic ratio in the resistance film can be set to an optimal amount by forming the boron doped polysilicon film, being the second film, and the surface of the second film is poly-crystallized with small irregularities, and therefore the bonding strength between the surface of the formed resistance film and the metal film formed thereon is strengthened, thus making it possible to solve the problem of deterioration of productivity (deterioration of production yield) of the device.

Further, when the resistance film is formed in such manner that the boron doped silicon germanium film is formed as the first film, and the boron doped silicon film is formed on the first film as the second film, the resistance film has a prescribed film thickness by forming the first film and the second film, and the ratio of the film thickness of the first film in the resistance film is varied, to thereby secure a prescribed resistance value.

Finally, the unloading step will be described. After the second film forming step is completed, in step S26, insides of the reaction tube and piping are cycle-purged with $N_2$ gas, and in step S28, the mass flow controller 24 is set so that a prescribed amount of $N_2$ gas is supplied into the reactor, namely, the processing chamber 1a, and the inside of the processing chamber 1a is returned to the atmospheric pressure. When the inside of the processing chamber 1a is returned to the atmospheric pressure, in step S30, the boat 3 supporting the wafer 4 after film formation is unloaded from inside to outside of the processing chamber 1a, and in step S32, the wafer 4 after film formation is naturally cooled. Finally, in step S34, the wafer 4 after film formation is taken out from the boat 3.

Note that as an example, processing conditions for processing the wafer 4 in the reaction furnace 12 of this embodiment, namely, processing conditions for forming the boron doped polysilicon germanium (B Doped Poly-SiGe) film on the wafer 4 as the first film are as follows:

processing temperature: 400 to 480° C.
processing pressure: 10 to 200 Pa
$SiH_4$ gas supply flow rate (total): 100 to 2000 sccm
$GeH_4$ gas supply flow rate (total): 100 to 5000 sccm
$BCl_3$ gas supply flow rate (total): 0.1 to 500 sccm.

Film forming process is applied to the wafer 4 by maintaining each processing condition to have a constant specific value in each range.

Further, processing conditions for forming the boron doped polysilicon (B Doped Poly-Si) film on the first film as the second film in the reaction furnace 12 of this embodiment are as follows:

processing temperature: 400 to 480° C.
processing pressure: 10 to 200 Pa
$SiH_4$ gas supply flow rate (total): 100 to 2000 sccm
$BCl_3$ gas supply flow rate (total): 0.1 to 500 sccm.

Film forming process is applied to the wafer 4 by maintaining each processing condition to have a constant specific value in each range.

In the above-described embodiment, explanation is given for an example of using the silane ($SiH_4$) gas as the silicon atom-containing gas, using the Boron trichloride ($BCl_3$) gas as the boron atom-containing gas, and using the Germane ($GeH_4$) gas as the germanium atom-containing gas, when the boron doped silicon germanium film is formed as the first film. However, disilane ($Si_2H_6$) gas and dichlorosilane ($SiH_2Cl_2$) gas may be used as the silicon atom-containing gas, and diborane ($B_2H_6$) gas and Boron trifluoride ($BF_3$) gas may be used as the boron atom-containing gas, and digermane ($Ge_2H_6$) gas may be used as the germanium atom-containing gas.

Also, in the above-described embodiment, explanation is given for an example of using the silane ($SiH_4$) gas as the silicon atom-containing gas, and using the Boron trichloride ($BCl_3$) gas as the boron atom-containing gas, when the boron doped silicon film is formed as the second film. However, disilane ($Si_2H_6$) gas and dichlorosilane ($SiH_2Cl_2$) gas may be used as the silicon atom-containing gas, and diborane ($B_2H_6$) gas and Boron trifluoride ($BF_3$) gas may be used as the boron atom-containing gas.

Incidentally, in the step of manufacturing the semiconductor device such as IC and LSI, for example by a vacuum CVD method (chemical vapor deposition method) and by using a vertical vacuum CVD apparatus, a film is formed on a substrate. However, in recent years, under lower temperature tendency (500° C. or less) of a capacitor portion where an electric charge of DRAM (dynamic random access memory) is accumulated and the processing temperature of doped polysilicon used in forming a joint to upper wiring, a polysilicon film doped with boron atoms capable of activating a carrier at a low temperature, namely, a boron doped polysilicon film, and a polysilicon germanium film doped with boron atoms, namely, a boron doped polysilicon germanium film are used. In these films, activation of the carrier is possible, for example, at processing temperature of 500° C. or less without executing heat treatment after film formation, and therefore deterioration of a logic transistor and the capacitor can be suppressed.

Meanwhile, with finer tendency of the semiconductor device, upper wiring width between devices has been narrowed year by year, and when a surface morphology of the doped polysilicon is deteriorated, which is used in forming a joint to the upper wiring, problems such as disconnection of the upper wiring or increase of the resistance value of a joint portion occur. Further, when a uniformity of a film thickness value as a film property in-surface or inter-surface direction of the wafer, a sheet resistance and resistivity is deteriorated, there is a problem that productivity of the device is deteriorated (production yield is deteriorated). Further in a mass production site, it is an essential requirement to uniformly and stably obtain the film property per every batch production and suppress the cost incurred in the batch production as much as possible, and these requirements are important factors in improving the productivity.

Inventors of the present invention obtain a knowledge that, excessively large germanium atomic ratio in the film of the boron doped silicon germanium film invites the deterioration of the surface morphology of polysilicon, resulting in a weak bonding strength between the boron doped silicon germanium film and the metal film, and unstable film property between batches.

Therefore, in order to poly-crystallize the film, under lower temperature condition (480° C. or less) while suppressing the germanium atomic ratio in the boron doped silicon germanium film, a film forming method is provided, including: forming a boron doped silicon germanium film containing germanium atoms with high concentration, namely the boron doped silicon germanium film containing germanium atoms with large germanium atomic ratio in the film, on the substrate as the first film; forming the boron doped silicon film on the first film as the second film, and forming the resistance film by the first film and the second film. Thus, the poly-crystallization is possible while the bonding strength between the resistance film and the metal film is maintained under the low temperature condition (480° C. or less).

According to this embodiment, at least one or more effects of the following effects can be exhibited.

(1) Poly-crystallization can be accelerated by forming the film containing germanium atoms with high concentration as the first film, and the second film formed on the first film can be ply-crystallized in accordance with the first film. Therefore, according to the conventional technique, processing at processing temperature 500° C. or less is necessary for poly-crystallization of the film. However, in this embodiment, the poly-crystallization is possible while suppressing the use amount of the germanium raw materials under further lower temperature condition, namely, at further lower processing temperature of 480° C. or less. For example, in a boron doped silicon germanium single film, the grain size of the germanium atom is large, and therefore when the germanium atomic ratio is large, there are problems that the surface of a base film can not be uniformly poly-crystallized, thus generating large irregularities on the surface of the film after film formation, resulting in weak bonding strength between the formed film and the metal film formed thereon. According to this embodiment, uniform poly-crystallization is achieved, and the resistance film having a flat surface can be formed. Thus, the bonding strength between the resistance film and the metal film is strengthened, and the productivity of the device is improved (production yield is improved). Note that under the low temperature condition, poly-crystallization is not possible, and a film in an amorphous state is formed. In such an amorphous state, electric conduction is not possible. However, poly-crystallization is possible even under the low temperature condition by forming the resistance film of this embodiment, and the electric conduction is also possible.

(2) The boron doped silicon germanium film containing germanium atoms with high concentration is formed as the first film, and the boron doped silicon film is formed on the first film as the second film, and the resistance film is formed by the first film and the second film. At this time, the resistance film having a prescribed film thickness is formed by forming the first film and the second film, and by varying the ratio of the film thickness of the first film in the resistance film, a prescribed resistance value can be secured.

(3) Further, in the boron doped silicon germanium single film, the film thickness and resistivity between continuous batches are unstable. However, by forming the resistance film of this embodiment, the bonding strength between the resistance film and the metal film is strengthened, thus making it possible to improve the stability of the film thickness and resistivity between continuous batches.

(4) A prescribed film thickness and film property can be secured, while suppressing the use amount of the germanium raw material, in accordance with a range of the prescribed film thickness.

(5) When metal films are bonded with each other, there is a problem that there is a high void generation rate, and device strength is weakened. By forming the aforementioned resistance film between the metal films, the void generation rate is reduced, and the device strength can be heightened.

(6) Film formation is possible while containing boron atoms in the silicon film, and therefore ion implantation treatment at high temperature is not necessary after film formation, and the boron doped silicon film can be formed without executing heat treatment thereafter at high temperature, thus making it possible to suppress a problem of thermal budget during film formation.

Further, in the above-described embodiment, the first film is formed and the second film is continuously formed. However, in this case, an influence of auto doping on the second film by the germanium atoms remained in the processing chamber can be considered, thus allowing a slight amount of the germanium atoms to be contained in the second film, and making it difficult to stably form a target resistance film. In order to solve such a state, it is desirable that after the first film is formed, the gas mass flow controller 21, the mass flow controller 28, and the mass flow controller 52 are set, to stop the supply of the $SiH_4$ gas, the $BCl_3$ gas, and the $GeH_4$ gas, then the inside of the processing chamber 1a is vacuum-replaced once, to exhaust the remained germanium atoms, and thereafter the supply flow rate of the $SiH_4$ gas and the $BCl_3$ gas are set by the gas mass flow controller 21 and the mass flow controller 28, to exhaust the inside of the processing chamber 1a from the exhaust tube 16 while supplying the $SiH_4$ gas and the $BCl_3$ gas into the processing chamber 1a from the nozzles and 14 respectively, and the pressure in the processing chamber 1a is stabilized, to thereby form the boron doped silicon film, namely, the boron doped polysilicon film on the first film as the second film by the thermal CVD method. Thus, it is possible to prevent the auto doping to the second film by the remained germanium atoms after film formation of the first film is completed, and stably form the target resistance film.

Second Embodiment

In the first embodiment, the boron doped silicon film is formed as the second film. However, the boron doped silicon germanium film containing germanium atoms may also be used as the second film. However, the germanium atomic ratio of the second film is set to be smaller than the germanium atomic ratio of the first film. The structure of the substrate processing apparatus is the same as the structure of the substrate processing apparatus of the first embodiment. Therefore, explanation therefore is omitted here.

Next, by using the substrate processing apparatus and as one step of the manufacturing steps of the semiconductor device, explanation will be given for a film forming method of forming the boron doped silicon film having a large germanium atomic ratio, namely, containing germanium atoms with high concentration, on the substrate as a first film, and on the first film, the boron doped silicon germanium film having smaller germanium atomic ratio than that of the first film, namely containing germanium atoms with low concentration, is formed as a second film, and the resistance film is formed by the first film and the second film. A film formation procedure is similar to that of the first embodiment (FIG. 2). Note that in the explanation given hereinafter, the operation of each part constituting the substrate processing apparatus is controlled by the controller 31.

First, the loading step will be described. In step S10, a plurality of wafers 4 are loaded (charged) into the boats 3, and in step S12, temperature in a reactor, namely a reaction furnace 12, is stabilized to a film forming temperature, and thereafter in step S14, each boat 3 charged with wafer 4 is loaded into the reaction furnace 12, namely into the processing chamber 1a. Next, in step S16, exhaust of an inside of the processing chamber 1a is started, and in step S18, nitrogen ($N_2$) gas purge is performed, so that moisture adsorbed on the boat 3 and the tube 12 is desorbed. Namely, the inside of the processing chamber 1a is exhausted from the exhaust tube 16 while supplying $N_2$ gas into the processing chamber 1a from the nozzle 40.

Next, the step of forming the resistance film having a prescribed film thickness will be described. First, the resistance film is formed in such a manner that the first film is formed in the first film forming step and thereafter the second film is formed in the second film forming step.

First, the first film forming step will be described. In step S20, in order to form the first film, the gas mass follow controller 21, the mass flow controller 28, and the mass flow controller 52 are set so that supply flow rates of the $SiH_4$ gas, the $BCl_3$ gas, and the $GeH_4$ gas are set to have a prescribed gas ratio respectively, then the inside of the processing chamber 1a is exhausted from the exhaust tube 16 while supplying the $SiH_4$ gas, the $BCl_3$ gas, and the $GeH_4$ gas into the processing chamber 1a from the nozzles 13 and the nozzles 14, to stabilize the pressure in the processing chamber 1a, and in step S22, the boron doped silicon germanium film having a large germanium atomic ratio, namely, the boron doped polysilicon germanium film containing germanium atoms with high concentration, is formed on the wafer 4 as the first film by the thermal CVD method. When the film thickness of the first film reaches a prescribed film thickness, the first film forming step is completed.

Subsequently, the second film forming step will be described. After the first film forming step is completed, in order to form the second film on the first film, in step S24, the gas mass flow controller 21, the mass flow controller 28, and the mass flow controller 52 are set so that the supply flow rates of the $SiH_4$ gas, the $BCl_3$ gas, and the $GeH_4$ gas are set to prescribed gas flow rates respectively, and the inside of the processing chamber 1a is exhausted from the exhaust tube 16 while supplying the $SiH_4$ gas, the $BCl_3$ gas, and the $GeH_4$ gas respectively into the processing chamber 1a from the nozzles 13 and the nozzles 14, to stabilize the pressure in the processing chamber 1a, and the boron doped silicon germanium film containing germanium atoms with low concentration, having smaller atomic ratio of germanium atoms than that of the first film, namely the boron doped polysilicon germanium film containing germanium atoms with low concentration, is formed on the first film as the second film by the thermal CVD method. When the film thickness of the resistance film formed by the first film and the second film reaches a prescribed film thickness, the second film forming step is completed.

Poly-crystallization of the first film is accelerated by forming the film having a large germanium atomic ratio in the film, and the second film formed on the first film can also be poly-crystallized in accordance with the first film. Therefore, according to a conventional technique, processing at processing temperature 500° C. or less is necessary for poly-crystallizing the film. However, poly-crystallization is possible at processing temperature of 480° C. or less, being a further low temperature condition, while suppressing the use amount of the germanium raw material. Further, conventionally a grain size of a germanium atom is large, and therefore if germanium atoms exist excessively in the film, for example, like a boron silicon germanium single film, great irregularities are generated on the surface of the poly-crystallized film, and the bonding strength between such a film and a metal film formed thereon is weakened, thus involving a problem that productivity of a device is deteriorated (production yield is deteriorated). However, according to this embodiment, the germanium atomic ratio in the film can be set to an optimal amount by forming the boron doped polysilicon germanium film of the second film containing germanium atoms with low concentration, and the surface of the second film is poly-crystallized with small irregularities, and therefore the bonding strength between the surface of the formed resistance film and the metal film formed thereon is strengthened, thus making it possible to solve the problem of deterioration of productivity (deterioration of production yield) of the device.

Further, when the resistance film is formed in such manner that the boron doped silicon germanium film containing germanium atoms with high concentration is formed as the first film, and the boron doped silicon germanium film containing germanium atoms with low concentration is formed on the first film as the second film, the resistance film has a prescribed film thickness by forming the first film and the second film and the ratio of the film thickness of the first film in the resistance film is varied, to thereby secure a prescribed resistance value. Further, the boron doped silicon germanium film containing germanium atoms with low concentration is formed as the second film, thus making a state in which germanium atoms exist in the resistance film. Thus, it is considered that the resistance film with a small resistivity value can be formed, and the processing temperature for film formation can be lowered.

Finally, the unloading step will be described. After the second film forming step is completed, in step S26, insides of the reaction tube and piping are cycle-purged with $N_2$ gas, and in step S28, the mass flow controller 24 is set so that a prescribed amount of $N_2$ gas is supplied into the reactor, namely, the processing chamber 1a, and the inside of the processing chamber 1a is returned to the atmospheric pressure. When the inside of the processing chamber 1a is returned to the atmospheric pressure, in step S30, the boat 3 supporting the wafer 4 after film formation is unloaded from inside to outside of the processing chamber 1a, and in step S32, the wafer 4 after film formation is naturally cooled. Finally, in step S34, the wafer 4 after film formation is taken out from the boat 3.

Note that as an example, processing conditions for processing the wafer 4 in the reaction furnace 12 of this embodiment, namely, processing conditions for forming the boron doped polysilicon germanium (B Doped Poly-SiGe) film containing germanium atoms with high concentration on the wafer 4 as the first film are as follows:
  processing temperature: 400 to 480° C.
  processing pressure: 10 to 200 Pa
  $SiH_4$ gas supply flow rate (total): 100 to 2000 sccm
  $GeH_4$ gas supply flow rate (total): 100 to 5000 sccm
  $BCl_3$ gas supply flow rate (total): 0.1 to 500 sccm.

Film forming process is applied to the wafer 4 by maintaining each processing condition to have a constant specific value in each range.

Further, processing conditions for forming the boron doped polysilicon germanium (B Doped Poly-SiGe) film containing germanium atoms with low concentration on the first film as the second film in the reaction furnace 12 of this embodiment are as follows:
  processing temperature: 400 to 480° C.
  processing pressure: 10 to 200 Pa
  $SiH_4$ gas supply flow rate (total): 100 to 2000 sccm
  $GeH_4$ gas supply flow rate (total): 100 to 5000 sccm
  $BCl_3$ gas supply flow rate (total): 0.1 to 500 sccm.

Film forming process is applied to the wafer 4 by maintaining each processing condition to have a constant specific value in each range.

However, the second film has a smaller germanium atomic ratio than that of the first film, namely, the second film is the film containing germanium atoms with low concentration. Therefore, an upper limit of a maximum supply amount of the $GeH_4$ gas of the second film is smaller than an upper limit of a maximum supply amount of the $GeH_4$ gas of the first film.

In the above-described embodiment, explanation is given for an example of using the silane ($SiH_4$) gas as the silicon atom-containing gas, using the Boron trichloride ($BCl_3$) gas as the boron atom-containing gas, and using the Germane ($GeH_4$) gas as the germanium atom-containing gas, when the boron doped silicon germanium film containing germanium atoms with high concentration is formed as the first film. However, disilane ($Si_2H_6$) gas and dichlorosilane ($SiH_2Cl_2$) gas may be used as the silicon atom-containing gas, and diborane ($B_2H_6$) gas and Boron trifluoride ($BF_3$) gas may be used as the boron atom-containing gas, and digermane ($Ge_2H_6$) gas may be used as the germanium atom-containing gas.

Similarly, in the above-described embodiment, explanation is given for an example of using the silane ($SiH_4$) gas as the silicon atom-containing gas, using the Boron trichloride ($BCl_3$) gas as the boron atom-containing gas, and using the Germane ($GeH_4$) gas as the germanium atom-containing gas, when the boron doped silicon germanium film containing germanium atoms with low concentration is formed as the second film. However, disilane ($Si_2H_6$) gas and dichlorosilane ($SiH_2Cl_2$) gas may be used as the silicon atom-containing gas, and diborane ($B_2H_6$) gas and Boron trifluoride ($BF_3$) gas may be used as the boron atom-containing gas, and digermane ($Ge_2H_6$) gas may be used as the germanium atom-containing gas.

According to this embodiment, at least one or more effects of the effects shown below can be exhibited.

(1) Poly-crystallization of the first film is accelerated by forming a film containing germanium atoms with high concentration, and the second film formed on the first film can also be poly-crystallized in accordance with the first film. Therefore, according to the conventional technique, processing at processing temperature 500° C. or less is necessary for poly-crystallizing the film. However, poly-crystallization is possible at processing temperature of 480° C. or less, being a further low temperature condition, while suppressing the use amount of the germanium raw material. For example, in the boron doped silicon germanium single film, the grain size of the germanium atom is large, and therefore when the germanium atomic ratio is large, there are problems that the film can not be poly-crystallized uniformly on the surface of the base film, thus generating large irregularities on the surface of the film after film formation, resulting in weakening of the bonding strength between such a film and the metal film formed thereon. However, according to this embodiment, uniform poly-crystallization is possible, and the resistance film having a flat surface can be formed. Thus, bonding strength between the resistance film and the metal film is strengthened, and the productivity of the device is improved (production yield is improved). Note that under the low temperature condition, poly-crystallization is not possible, thus forming a film in an amorphous state, and electric conduction is not possible in the amorphous state. However, by forming the resistance film of this embodiment, poly-crystallization is possible even under the low temperature condition, and the electric conduction is also possible.

(2) When the resistance film is formed in such manner that the boron doped silicon germanium film containing germanium atoms with high concentration is formed as the first film, and the boron doped silicon germanium film containing germanium atoms with low concentration is formed on the first film as the second film, the resistance film having a prescribed film thickness is formed by the first film and the second film, and by varying the ratio of the film thickness of the first film in the resistance film, a prescribed resistance value can be secured. Further, the boron doped silicon germanium film containing germanium atoms with low concentration is formed on the second film, to make a state in which germanium atoms exist in the resistance film. Thus, it is considered that the resistance film with a small resistivity value can be formed, and the processing temperature for film formation can be lowered.

(3) Further, the film thickness and resistivity between continuous batches are unstable in the boron doped silicon germanium single film. However, by forming the resistance film of this embodiment, the bonding strength between the resistance film and the metal film is strengthened, and the stability of the film thickness and resistivity between continuous batches can be improved.

(4) A prescribed film thickness and film property can be secured while suppressing the use amount of the germanium raw material, in accordance with the range of the prescribed film thickness.

(5) When metal films are bonded with each other, a problem involved therein is that there is a high void generation rate and a device strength is weakened. By forming the aforementioned resistance film between the metal films, the void generation rate is reduced, and the device strength can be heightened.

(6) Film formation is possible while containing boron atoms in the silicon film, and therefore ion implantation treatment at high temperature is not necessary after film formation, and the boron doped silicon film can be formed without executing heat treatment thereafter at high temperature, thus making it possible to suppress a problem of thermal budget during film formation.

Further, in the above-described embodiment, the first film is formed and the second film is continuously formed. However, in this case, an influence of auto doping on the second film by the germanium atoms remained in the processing chamber can be considered, thus allowing a slight amount of the germanium atoms to be contained in the second film, resulting in increasing the germanium atoms of the second film, thus making it difficult to stably form a target resistance film. In order to solve such a state, it is desirable that after the first film is formed, the gas mass flow controller 21, the mass flow controller 28, and the mass flow controller 52 are set, to stop the supply of the $SiH_4$ gas, the $BCl_3$ gas, and the $GeH_4$ gas, then the inside of the processing chamber 1a is vacuum-replaced once, to exhaust the remained germanium atoms, and thereafter the supply flow rate of the $SiH_4$ gas and the $BCl_3$ gas are set by the gas mass flow controller 21 and the mass flow controller 28, and the mass flow controller 52 to exhaust the inside of the processing chamber 1a from the exhaust tube 16 while supplying the $SiH_4$ gas and the $BCl_3$ gas into the processing chamber 1a from the nozzles 13 and 14 respectively, and the pressure in the processing chamber 1a is stabilized, to thereby form the boron doped silicon germanium film containing germanium atoms with low concentration, namely, the boron doped polysilicon germanium film containing germanium atoms with low concentration on the first film as the second film by the thermal CVD method. Thus, it is possible to prevent the auto doping to the second film by the remained germanium atoms after the film formation of the first film is completed, and stably form the target resistance film.

In the above-described embodiment, the resistance film is formed by two films of the first film and the second film. However, it is also acceptable to execute film formation while gradually reducing the germanium atom-containing gas supplied at the time of forming the first film and stop the supply of the germanium atom-containing gas at the time of completing the film formation, thus gradually reducing the germanium atomic ratio. Thus, the resistance film can be formed by one film. Further, it can be considered that the problem of auto doping of the remained germanium atoms can be reduced, thereby making it possible to eliminate a process of vacuum-replacing the inside of the processing chamber, thus shortening the processing time and improving the productivity.

Note that explanation has been given for the example of using the nozzle for supplying $GeH_4$ gas and the nozzle for supplying the $SiH_4$ gas in common. However, the nozzle for supplying the $GeH_4$ gas may be provided separately from the nozzle for supplying the $SiH_4$ gas.

Note that in the first film forming step of forming the first film and the second film forming step of forming the second film, although the temperature in the processing chamber may be varied, control at a fixed temperature is desirable. When the temperature is varied, a prescribed time is required until the temperature is stabilized. In the first and second film forming steps, a fixed processing temperature makes it possible to shorten the time required for making the temperature stable to be a set temperature, compared with a case when the processing is performed at different temperatures, and the productivity can be improved.

Note that the present invention is not limited to a batch-type apparatus and can be applied to a single wafer processing-type apparatus.

EXAMPLE

By using the substrate processing apparatus according to the first embodiment shown in FIG. 1, the boron doped polysilicon germanium film was formed on the wafer, being the wafer having 12 inches, as the first film, and on the first film, the boron doped polysilicon film was formed as the second film, and the resistance film is formed by the first film and the second film. Note that the film forming conditions of the first film were set as:
processing temperature: 450° C.
processing pressure: 40 Pa,
and the film forming conditions of the second film were set as:
processing temperature: 450° C.
processing pressure: 60 Pa.

FIG. 3 shows a relation between the resistivity of an entire body of the resistance film when the aforementioned resistance film is formed, and a film thickness ratio of the boron doped polysilicon germanium film in the resistance film. The vertical axis shows the resistivity, and the horizontal axis shows the ratio of the film thickness of the boron doped polysilicon germanium film ($THK_{BdopePolySiGe}$) with respect to the film thickness of the entire body of the film that forms the structure of the resistance film (sum of the film thickness of the boron doped polysilicon germanium film and the film thickness of the boron doped polysilicon film, $THK_{BdopePolySiGe}$  $THK_{BdopePolySi}$) ($THK_{BdopePolySiGe}/(THK_{BdopePolySiGe}+THK_{BdopePolySi})$). Also, FIG. 4 shows an example of the structure of the resistance film.

As shown in FIG. 3, with an increase of the ratio of the film thickness of the boron doped polysilicon germanium film in the resistance film, reducing tendency of the resistivity is observed. The reason therefore can be considered that carrier mobility of a germanium atom is higher than that of a silicon atom, due to a difference in band gap, and therefore with an increase of the film thickness of the first film containing germanium atoms, the germanium atomic ratio is increased, thus lowering the resistivity of the entire body of the resistance film. Thus, when the resistance film is formed, the first film and the second film are formed, then the resistance film having a prescribed film thickness is formed by the first film and the second film, and by varying the ratio of the film thickness of the first film in the resistance film, a prescribed resistivity can be secured.

Next, explanation will be given for a state of the poly-crystallization in a case of forming the resistance film under various film forming conditions. First, as the first condition, explanation will be given for a case that the resistance film is formed by the boron doped polysilicon germanium film containing germanium atoms with high concentration as the first film, and the boron doped silicon film as the second film.

FIG. 5 shows a relation under first condition, between the resistivity when the germanium atomic ratio of the first film, namely germanium atom-containing concentration is varied, and the germanium atom-containing concentration. Also, FIG. 5 shows an observation result of a surface morphology when the resistance film is formed under each condition. Note that the film forming conditions of the first or the second film were set as:
processing temperature: 450° C.
processing pressure: 40 Pa for the first film
60 Pa for the second film.

In FIG. 5, the vertical axis shows the resistivity of the resistance film (product of a film thickness value of the resistance film and a sheet resistance value, $\mu ohm \cdot cm$), and the horizontal axis shows the germanium atom-containing concentration (atomic percent, shown as at % hereinafter) of the boron doped polysilicon germanium film containing germanium atoms as the first film, and symbol (●) shows the resistivity at a germanium atom-containing concentration level of the first film in each case of varying the germanium atom-containing concentration of the first film. Further, the observation result of the surface morphology of the resistance film formed under each condition is also shown.

In FIG. 5, decreasing tendency of the resistivity is observed, with an increase of the germanium atom-containing concentration of the first film. This is because gas decomposing temperature of monogermane, being source gas of the germanium atoms is lower than the gas decomposing temperature of monosilane, and therefore by increasing the germanium atom-containing concentration of the first film, the ratio of the decomposed gas is increased, then crystal nucleating is facilitated and the film is poly-crystallized. Further, the carrier mobility of the germanium atom is higher than that of the silicon atom, due to the difference in band gap, and therefore it can be considered that as the germanium atom-containing concentration is increased, the resistivity is lowered. Moreover, regarding the result of the surface morphology of the resistance film formed under each condition also, as the germanium atom-containing concentration is increased, there are less discontinuous portions, and it is found that the films is poly-crystallized.

Next, explanation will be given for the result of a stability evaluation of the film property between continuous batches under a condition of forming the resistance film. FIG. 6 shows the stability of the film thickness between continuous batches, and FIG. 7 shows the stability of the resistivity between continuous batches. A target film is formed here under the film forming conditions of the resistance film, such as 7 at % and 29 at % of the germanium atom-containing concentration of the first film. Here, an index showing stability is shown by RtR value (a quotient resulting from dividing a variation degree of target values by an average value), and when this value is ±1.0% or less, a stable film property between continuous batches is achieved. In FIG. 6, the vertical axis shows the film thickness (nm), and the horizontal axis shows RUN No. indicating the number of times of batches, and circle (●) shows a case in which the germanium atom-containing concentration of the first film is 7 at %, and square (■) shows a case in which the germanium atom-containing concentration of the first film is 29 at %. Further, the RtR value in each condition is shown in FIG. 6, and the RtR value is shown as ±1.38% when the germanium atom-containing concentration is 7 at %, and is shown as ±0.24% when the germanium atom-containing concentration is 29 at %.

Subsequently, in FIG. 7, the vertical axis shows the resistivity ($\mu ohm \cdot cm$) and the horizontal axis shows RUN No. indicating the number of times of batches, and circle (●) shows a case in which the germanium atom-containing concentration is 7 at %, and square (■) shows a case in which the germanium atom-containing concentration is 29 at %. Further, the RtR value in each condition is shown in FIG. 7, and the RtR value is shown as ±2.73% when the germanium atom-containing concentration is 7 at %, and is shown as ±0.41% when the germanium atom-containing concentration is 29 at %.

As shown in FIG. 6 and FIG. 7, it is found that the RtR value is ±1.0 or less by increasing the germanium atom-containing concentration of the first film, to make the film thickness and resistivity between continuous batches stable. Thus, it is found that high germanium atom-containing concentration of the first film of the formed resistance film is important, and when the germanium atom-containing concentration of the first film of the resistance film is set to be high, poly-crystallization is facilitated under low temperature condition (480° C. or less), and the stability of the film property between continuous batches can be improved.

Next, explanation will be given for a case in which the resistance film is formed by the boron doped polysilicon germanium film containing germanium atoms with high concentration, and the boron doped silicon germanium film of the second film having smaller germanium atomic ratio than that of the first film, namely containing germanium atoms with low concentration.

FIG. 8 shows the relation between the resistivity in a case of varying the germanium atom-containing concentration of the first film in the resistance film formed by the boron doped silicon germanium film of the first film containing germanium atoms with high concentration and the boron doped polysilicon germanium film of the second film containing germanium atoms with low concentration, and the germanium atom-containing concentration of the first film. The germanium atom-containing concentration of the second film at this time was set to 29 at %, and a result of the resistivity by varying the germanium atom-containing concentration of the first film was examined. Note that the film forming conditions of the first or the second film were set as processing temperature: 450° C., and processing pressure: 40 Pa. In FIG. 8, the vertical axis shows the resistivity of the resistance film (μohm·cm), and the horizontal axis shows the germanium atom-containing concentration (at %) of the boron doped polysilicon germanium film of the first film containing germanium atoms with high concentration, and circle (●) shows the resistivity in the germanium atom-containing concentration of the first film in each case of varying the germanium atom-containing concentration of the first film.

In FIG. 8, decreasing tendency of the resistivity is observed, with an increase of the germanium atom-containing concentration of the first film. This is because gas decomposing temperature of monogermane, being source gas of the germanium atom is lower than the gas decomposing temperature of monosilane, and therefore by increasing the germanium atom-containing concentration of the first film, the ratio of the decomposed gas is increased, then crystal nucleating is facilitated and the film is poly-crystallized.

Next, explanation will be given for the result of a stability evaluation of the film property between continuous batches under a condition of forming the resistance film. FIG. 9 shows the stability of the film thickness between continuous batches, and FIG. 10 shows the stability of the resistivity between continuous batches. A target film is formed here under the film forming conditions of the resistance film, such as 58 at % and 100 at % of the germanium atom-containing concentration of the first film, and 29 at % of the germanium atom-containing concentration of the second film.

In FIG. 9, the vertical axis shows the film thickness (nm), and the horizontal axis shows RUN No. indicating the number of times of batches, circle (●) shows a case of 58 at % of the germanium atom-containing concentration of the first film, and square (■) shows a case of 10 at of the germanium atom-containing concentration of the first film. Also, in FIG. 9, RtR value in each condition is shown, such as ±0.14% when the germanium atom-containing concentration of the first film is 100 at %, and ±0.11% when the germanium atom-containing concentration of the first film is 58 at %.

Subsequently, in FIG. 10, the vertical axis shows the resistivity (μohm·cm) and the horizontal axis shows RUN No. indicating the number of times of batches, and circle (●) shows a case in which the germanium atom-containing concentration of the first film is 58 at %, and square (■) shows a case in which the germanium atom-containing concentration is 100 at %. Further, the RtR value in each condition is shown in FIG. 10, and the RtR value is shown as ±0.73% when the germanium atom-containing concentration of the first film is 58 at %, and is shown as ±0.13% when the germanium atom-containing concentration is 100 at %.

As shown in FIG. 9 and FIG. 10, it is found that the RtR value is ±1.0 or less by increasing the germanium atom-containing concentration of the first film, and the film thickness and resistivity between continuous batches are stable. Also, it is found that the higher the concentration of the germanium atom-containing concentration of the first film is, the more satisfactory the RtR value is. Namely, it is found that the film property becomes stable. Thus, it is found that high germanium atom-containing concentration of the first film of the resistance film is important, and when the germanium atom-containing concentration of the first film of the resistance film is set to be high, poly-crystallization is facilitated under low temperature condition (480° C. or less), and the stability of the film property between continuous batches can be improved.

Next, explanation will be given for a case that the germanium atom-containing concentration of the second film is varied under the second condition. FIG. 11 shows a relation between the resistivity in a case of varying the germanium atom-containing concentration of the second film in the resistance film formed by the boron doped polysilicon germanium film of the first film containing germanium atoms with high concentration and the boron doped silicon germanium film of the second film containing germanium atoms with low concentration, and the germanium atom-containing concentration of the second film. The germanium atom-containing concentration of the first film at this time was set to 58 at %, and a result of the resistivity by varying the germanium atom-containing concentration of the second film was examined. Note that the film forming conditions of the first or the second film were set as processing temperature: 450° C., and processing pressure: 40 Pa. In FIG. 11, the vertical axis shows the resistivity of the resistance film (μohm·cm), and the horizontal axis shows the germanium atom-containing concentration (at %) of the boron doped polysilicon germanium film of the second film containing germanium atoms with low concentration, and circle (●) shows the resistivity in the germanium atom-containing concentration of the second film in each case of varying the germanium atom-containing concentration of the second film.

In FIG. 11, decreasing tendency of the resistivity is observed, with an increase of the germanium atom-containing concentration of the second film. This is because gas decomposing temperature of monogermane, being source gas of the germanium atom is lower than the gas decomposing temperature of monosilane, and therefore by increasing the germanium atom-containing concentration of the second film, the ratio of the decomposed gas is increased, then crystal nucleating is facilitated and the film is poly-crystallized.

Next, explanation will be given for the result of the stability evaluation of the film property between continuous batches under a condition of forming the resistance film. FIG. 12 shows the stability of the film thickness between continuous batches, and FIG. 13 shows the stability of the resistivity between continuous batches. A target film is formed here under the film forming conditions of the resistance film, such as 58 at % of the germanium atom-containing concentration of the first film, and 29 at % and 22 at % of the germanium atom-containing concentration of the second film.

In FIG. 12, the vertical axis shows the film thickness (nm), and the horizontal axis shows RUN No. indicating the number of times of batches, circle (●) shows a case of 22 at % of the germanium atom-containing concentration, and square (■) shows a case of 29 at % of the germanium atom-containing concentration. Also, in FIG. 12, the RtR value in each condition is shown, such as ±0.45% when the germanium atom-containing concentration is 22 at %, and ±0.11% when the germanium atom-containing concentration is 29 at %.

Subsequently, in FIG. 13, the vertical axis shows the resistivity (μohm·cm) and the horizontal axis shows RUN No. indicating the number of times of batches, and circle (●) shows a case in which the germanium atom-containing concentration is 22 at %, and square (■) shows a case in which the germanium atom-containing concentration is 29 at %. Further, the RtR value in each condition is shown in FIG. 13, and the RtR value is shown as ±0.99% when the germanium atom-containing concentration is 22 at %, and is shown as ±0.73% when the germanium atom-containing concentration is 29 at %.

As shown in FIG. 12 and FIG. 13, it is found that the RtR value is ±1.0 or less by increasing the germanium atom-containing concentration of the second film, and the film thickness and resistivity between continuous batches are stable. Also, it is found that the higher the concentration of the germanium atom-containing concentration is, the more satisfactory the RtR value is. However, there is no great change, compared with a case in which the germanium atom-containing concentration of the first film is varied. Thus, it is found that high germanium atom-containing concentration of the first film is important, and in this case, even if the germanium atom-containing concentration of the second film is low, both of the film thickness and resistivity would be stable between continuous batches. Namely, high germanium atom-containing concentration of the first film is important, irrespective of the germanium atom-containing concentration of the second film of the resistance film, and it can be considered that poly-crystallization is facilitated and the stability of the film property between continuous batches can be improved, owing to the high germanium atom-containing concentration of the first film of the resistance film.

Next, explanation will be given for a result of evaluating an influence in a case of varying the germanium atom-containing concentration of the second film under the second condition. FIG. 11 shows a relation between the resistivity in a case of varying the germanium atom-containing concentration of the second film in the resistance film formed by the boron doped polysilicon germanium film of the first film containing germanium atoms with high concentration and the boron doped silicon germanium film of the second film containing germanium atoms with low concentration, and the germanium atom-containing concentration of the second film. The germanium atom-containing concentration of the first film at this time was set to 70 at %, and a result of the resistivity by varying the germanium atom-containing concentration of the second film was examined. Note that the film forming conditions of the first or the second film were set as processing temperature: 420° C., and processing pressure: 40 Pa. In FIG. 11, the vertical axis shows the resistivity of the resistance film (μohm·cm), and the horizontal axis shows the germanium atom-containing concentration (at %) of the boron doped polysilicon germanium film of the second film containing germanium atoms with low concentration, and circle (●) shows the resistivity in the germanium atom-containing concentration of the second film in each case of varying the germanium atom-containing concentration of the second film. Also, a result of the surface morphology under each condition is shown.

In FIG. 14, decreasing tendency of the resistivity is observed, with an increase of the germanium atom-containing concentration of the second film. This is because gas decomposing temperature of monogermane, being source gas of the germanium atom is lower than the gas decomposing temperature of monosilane, and therefore by increasing the germanium atom-containing concentration of the second film, the ratio of the decomposed gas is increased, then crystal nucleating is facilitated and the film is poly-crystallized. Further, the carrier mobility of the germanium atom is higher than that of silicon, due to difference of band gap, and therefore it can be considered that as the germanium atom-containing concentration is higher, the resistivity is lowered. Moreover, similarly, regarding the result of each surface morphology also, it is found that as the germanium atom-containing concentration is higher, there are less discontinuous portions, and poly-crystallization occurs.

Next, explanation will be given for the result of a stability evaluation of the film property between continuous batches under a condition of forming the resistance film. FIG. 15 shows the stability of the film thickness between continuous batches, and FIG. 16 shows the stability of the resistivity between continuous batches. A target film is formed here under the film forming conditions of the resistance film, such as 70 at % of the germanium atom-containing concentration of the first film, and 37 at % and 47 at % of the germanium atom-containing concentration of the second film. In FIG. 15, the vertical axis shows the film thickness (nm), and the horizontal axis shows RUN No. indicating the number of times of batches, and circle (●) shows a case in which the germanium atom-containing concentration is 37 at %, and square (■) shows a case in which the germanium atom-containing concentration is 47 at %. Further, the RtR value in each condition is shown in FIG. 15, and the RtR value is shown as ±0.56% when the germanium atom-containing concentration is 37 at %, and is shown as ±0.30% when the germanium atom-containing concentration is 47 at %.

Subsequently, in FIG. 16, the vertical axis shows the resistivity (μohm·cm) and the horizontal axis shows RUN No. indicating the number of times of batches, and circle (●) shows a case in which the germanium atom-containing concentration is 37 at %, and square (■) shows a case in which the germanium atom-containing concentration is 47 at %. Further, the RtR value in each condition is shown in FIG. 16, and the RtR value is shown as ±0.67% when the germanium atom-containing concentration is 37 at %, and is shown as ±0.13% when the germanium atom-containing concentration is 47 at %.

As shown in FIG. 15 and FIG. 16, it is found that the RtR value is ±1.0 or less by increasing the germanium atom-containing concentration of the second film, and the film thickness and resistivity between continuous batches are stable, and as the germanium atom-containing concentration is higher, the more satisfactory the RtR value is. However, there is no great change, compared with a case in which the germanium atom-containing concentration of the first film is varied. Thus, it is found that high germanium atom-containing concentration of the first film is important, and in this case, it can be considered that both of the film thickness and the resistivity are stable between continuous batches even if the germanium atom-containing concentration of the second film is low. Thus, it can be considered that high germanium atom-containing concentration of the first film of the resistance film is important, irrespective of the germanium atom-containing concentration of the second film even under the low temperature condition, and when the germanium atom-containing concentration of the first film of the resistance film is set to be high, poly-crystallization is facilitated under low temperature condition (480° C. or less), and the stability of the film property between continuous batches can be improved.

FIG. 17 is a view showing a state of the surface of the resistance film to be formed, and particularly describes a relation between the result of the surface morphology at processing temperature of 420° C. and 450° C., and the germanium atom-containing concentration of the second film. The resistance film at this time is formed by the boron doped polysilicon germanium film as the first film containing germanium atoms with high concentration, being 58 at % of germanium atom-containing concentration, and as the second film, the boron doped polysilicon film or the boron doped polysilicon germanium film containing germanium atoms with low concentration, being various germanium containing concentrations.

In FIG. 17, the vertical axis shows the processing temperature (centigrade ° C.), and the horizontal axis shows the germanium atom-containing concentration (at %) of the second film, and a surface state of the formed resistance film is shown by dividing it into three areas by solid line, such as an amorphous stable area, a poly-crystallized stable area, and a mixed crystal area where both of them coexist. Also, the result of the surface morphology is shown under each forming condition of the resistance film.

First, explanation will be given for a relation between the result of the surface morphology of the resistance film and the germanium atom-containing concentration. As shown in the morphology result in FIG. 17, dependency of the germanium atom-containing concentration of the second film at processing temperature of 450° C. is shown as (A) in a case of 20 at % and (B) in a case of 29 at % of the germanium atom-containing concentration of the second film.

From the results of the morphology of (A) and (B), it is found that as the germanium atom-containing concentration becomes higher, the poly-crystallization is easy to occur. Also, as shown in the morphology result in FIG. 17, dependency of the germanium atom-containing concentration of the second film at processing temperature of 420° C. is shown as (C) in a case of 29 at %, (D) in a case of 37 at %, and (E) in a case of 47 at % of the germanium atom-containing concentration of the second film. Then, from the results of the morphology observation of (C), (D), and (E), it is found that in the same way as the case of processing temperature 450° C., as the germanium atom-containing concentration becomes higher, the poly-crystallization is easy to occur.

Next, explanation will be given for a relation between the processing temperature of the resistance film and the germanium atom-containing concentration. A lower limit value of the germanium atom-containing concentration necessary for poly-crystallization is higher in the case of the processing temperature 420° C. than in the case of the processing temperature 450° C. This is because monosilane gas, being source gas having relatively high gas decomposing temperature is not sufficiently decomposed, due to low processing temperature, and thereby crystal nucleus to be nucleated becomes insufficient. In order to cause sufficient crystal nucleation to occur, by supplying a large amount of monogermane gas, being the source gas having lower gas decomposing temperature than that of the monosilane gas, namely by increasing the germanium atom-containing concentration, the poly-crystallization can be accelerated under low temperature condition. The same tendency can be observed in a case of processing at a further low temperature.

The aforementioned contents are concluded as follows.

(1) High germanium atom-containing concentration of the first film in the resistance film is important, and by achieving such a high concentration, the poly-crystallization is accelerated, thus improving the stability of the film thickness and resistivity, being the film property between continuous batches of the formed resistance film.

(2) The germanium atom-containing concentration of the second film has smaller influence on the stability of the film property between continuous batches, compared with the germanium atom-containing concentration of the first film, and when germanium atoms are not contained in the second film, or when the germanium atom-containing concentration of the second film is low, the resistance film having stable film property can be formed.

(3) In the same way as (1), the germanium atom-containing concentration of the first film is still high even under the low temperature condition, thereby accelerating the poly-crystallization and improving the stability of the film thickness and resistivity of the resistance film, being the film properties between continuous batches.

(4) However, there is a problem that as the processing temperature becomes lower, the germanium atom-containing concentration becomes higher. Thus, the germanium atoms are excessively contained in the resistance film, particularly in the second film, and therefore it can be considered that the bonding strength between the resistance film and the metal film formed thereon is lowered, resulting in a deterioration of the productivity (deterioration of the production yield).

(5) As described above, it is desirable to set the germanium atom-containing concentration of the first film in a range of 29 at % or more and 100 at % or less. Also it is desirable to set the germanium atom-containing concentration of the second film in a range of 22 at % or more and 58 at % or less, and it is desirable to set the germanium atom-containing concentration of the second film to be lower than the germanium atom-containing concentration of the first film.

(6) Also, in a case that a substrate temperature during film formation is set to be less than 380° C., high germanium atom-containing concentration is necessary for obtaining the poly-crystallized film, and the bonding strength between the surface of the resistance film and the metal film is accordingly lowered. Meanwhile, when the substrate temperature is higher than 480° C., a problem of thermal budget is easy to occur. Therefore, substrate temperatures of the first film and the second film are desirably set to 380° C. or more and 480° C. or less.

(7) Further preferably, the substrate temperatures of the first film and the second film are 400° C. or more and 450° C. or less, thus making it possible to obtain further appropriate bonding strength between these films and the metal film, and the problem of thermal budget can be solved.

(8) Further preferably, the substrate temperatures of the first film and the second film are 420° C. or more and 450° C. or less, thus making it possible to obtain further appropriate bonding strength between these films and the metal film, and the problem of thermal budget can be solved and also the resistance film can be stably formed.

(9) Further preferably, the first and second films are formed in a state of being controlled to be the same temperatures.

DESCRIPTION OF PREFERRED ASPECTS OF THE INVENTION

According to an aspect of the present invention, there is provided a manufacturing method of a semiconductor device, including:

loading a substrate into a processing chamber;

forming a first film on the substrate by supplying silicon atom-containing gas, boron atom-containing gas, and germanium atom-containing gas into the processing chamber;

forming a second film on the first film by supplying the silicon atom-containing gas and the boron atom-containing gas into the processing chamber; and unloading the substrate from the processing chamber.

Preferably, in the first film forming step, silane ($SiH_4$) gas or disilane ($Si_2H_6$) gas or dichlorosilane ($SiH_2Cl_2$) gas is used as the silicon atom-containing gas, and Boron trichloride (BCl$_3$) gas or diborane (B$_2$H$_6$) gas or Boron trifluoride (BF$_3$) gas is used as the boron atom-containing gas, and Germane (GeH$_4$) gas or digermane (Ge$_2$H$_6$) gas is used as the germanium atom-containing gas, to form a boron doped silicon germanium film as the first film.

Preferably, in the first film forming step, silane (SiH$_4$) gas is used as the silicon atom-containing gas, and Boron trichloride (BCl$_3$) gas is used as the boron atom-containing gas, and Germane (GeH$_4$) gas is used as the germanium atom-containing gas, to form the boron doped silicon germanium film as the second film.

Preferably, in the second film forming step, silane (SiH$_4$) gas or disilane (Si$_2$H$_6$) gas or dichlorosilane (SiH$_2$Cl$_2$) gas is used as the silicon atom-containing gas, and Boron trichloride (BCl$_3$) gas or diborane (B$_2$H$_6$) gas or Boron trifluoride (BF$_3$) gas is used as the boron atom-containing gas, to form a boron doped silicon film as the second film.

Preferably, in the second film forming step, silane (SiH$_4$) gas is uses as the silicon atom-containing gas, and Boron trichloride (BCl$_3$) gas is used as the boron atom-containing gas, to form the boron doped silicon film as the second film.

Preferably, a germanium atom-containing concentration of the first film is 29 at % or more and at % or less. The germanium atom-containing concentration of the second film is 20 at % or more and 58 at % or less, wherein the germanium atom-containing concentration of the second film is lower than the germanium atom-containing concentration of the first film.

Preferably, substrate temperatures of the first film and the second film are 380° C. or more and 480° C. or less, and the first film and the second film are formed in a state of being controlled to be the same temperatures.

According to another aspect of the present invention, there is provided a manufacturing method of a semiconductor device comprising:

loading a substrate into a processing chamber;

forming a first film on the substrate by supplying silicon atom-containing gas, boron atom-containing gas, and germanium atom-containing gas into the processing chamber;

forming a second film on the first film by supplying the silicon atom-containing gas, the boron atom-containing gas, and the germanium atom-containing gas into the processing chamber; and unloading the substrate from the processing chamber.

According to further another aspect of the present invention, there is provided a substrate processing apparatus, comprising:

the processing chamber for processing a substrate; and a silicon atom-containing gas supply system for supplying the silicon atom-containing gas into the processing chamber;

a boron atom-containing gas supply system for supplying the boron atom-containing gas into the processing chamber;

a germanium atom-containing gas supply system for supplying the germanium atom-containing gas into the processing chamber; and a controller for controlling the silicon atom-containing gas supply system, the boron atom-containing gas supply system, and the germanium atom-containing gas supply system, so as to supply the silicon atom-containing gas, the boron atom-containing gas, and the germanium atom-containing gas into the processing chamber, to form the first film on the substrate as the first film forming step, and supply the silicon atom-containing gas and the boron atom-containing gas into the processing chamber, to form a second film on the first film, under changeable film forming conditions of the first film and the second film.

According to further another aspect of the present invention, there is provided a substrate processing apparatus, comprising:

the processing chamber for processing a substrate;

a silicon atom-containing gas supply system for supplying the silicon atom-containing gas into the processing chamber;

a boron atom-containing gas supply system for supplying the boron atom-containing gas into the processing chamber;

a germanium atom-containing gas supply system for supplying the germanium atom-containing gas into the processing chamber; and a controller for controlling the silicon atom-containing gas supply system, the boron atom-containing gas supply system, and the germanium atom-containing gas supply system, so as to supply the silicon atom-containing gas, the boron atom-containing gas, and the germanium atom-containing gas into the processing chamber, to form the first film on the substrate as the first film forming step, and supply the silicon atom-containing gas, the boron atom-containing gas, and the germanium atom-containing gas into the processing chamber, to form a second film on the first film, with smaller ratio of germanium atoms than that of the first film, under changeable film forming conditions of the first film and the second film.

Figure 1:
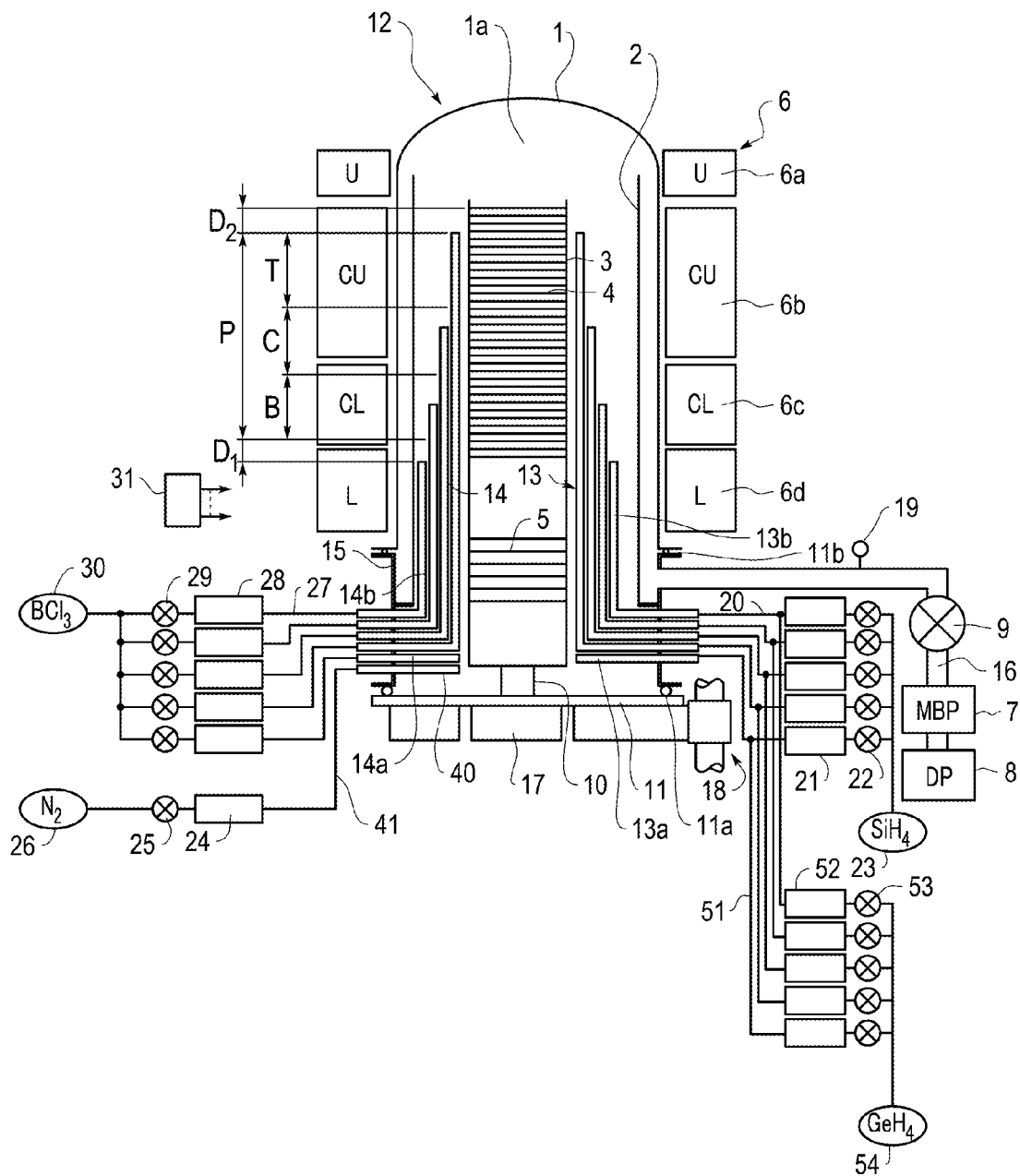
FIG. 1 is a schematic view showing a substrate processing apparatus according to a first embodiment of the present invention.
Figure 2:
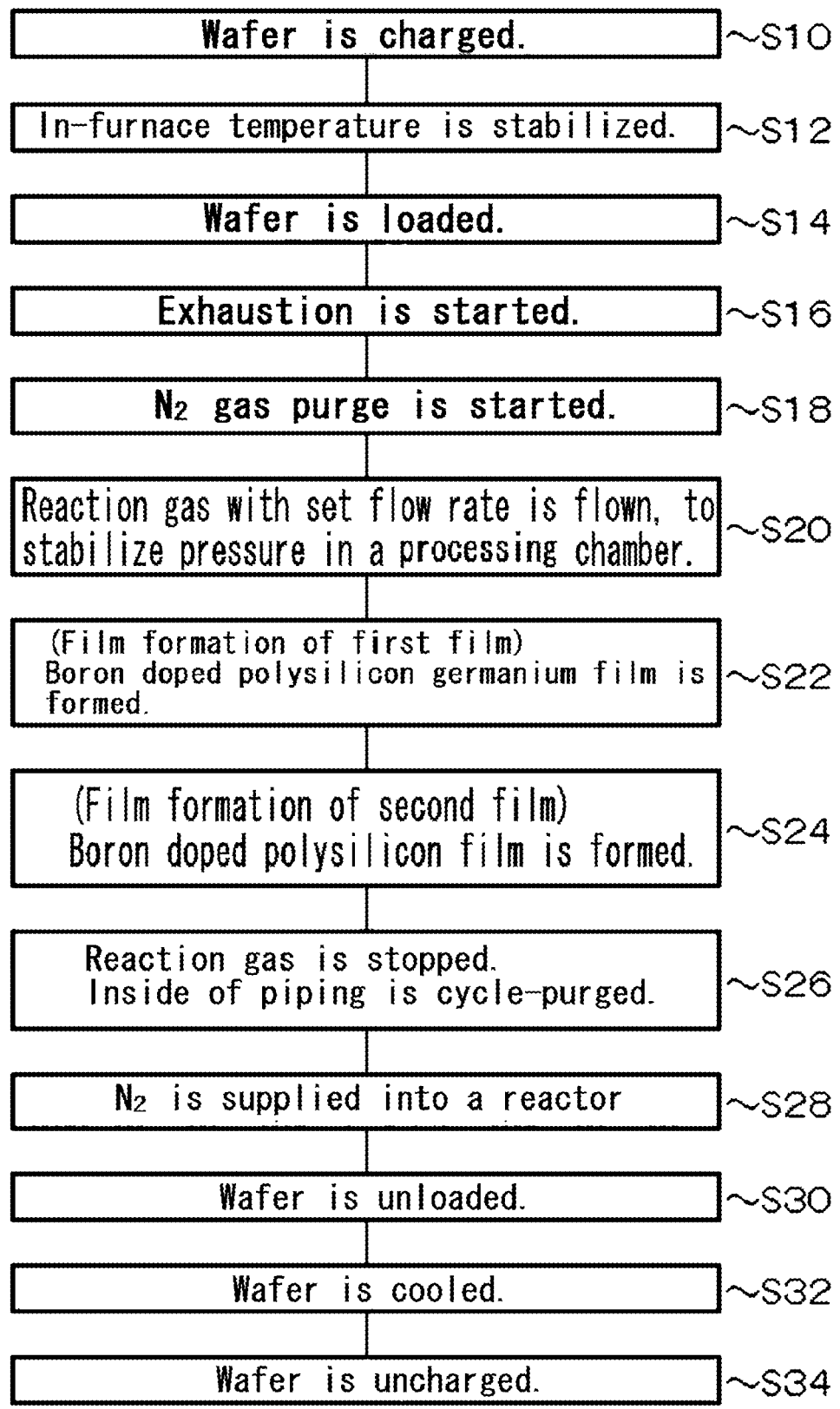
FIG. 2 is a flowchart showing a film forming procedure in a manufacturing method of a semiconductor device according to the first embodiment of the present invention.
Figure 3:
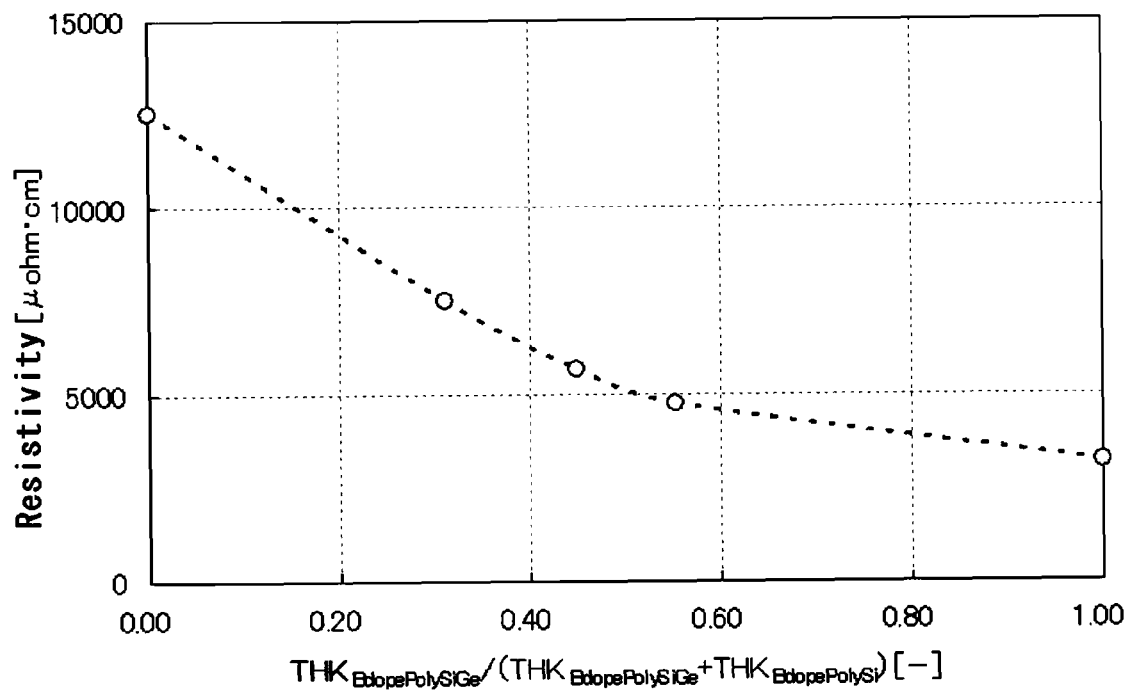
FIG. 3 is a view showing a relation between resistivity of a resistance film formed by a boron doped polysilicon germanium film and a boron doped polysilicon film, and a film thickness of the boron doped polysilicon germanium film in the resistance film.
Figure 4:
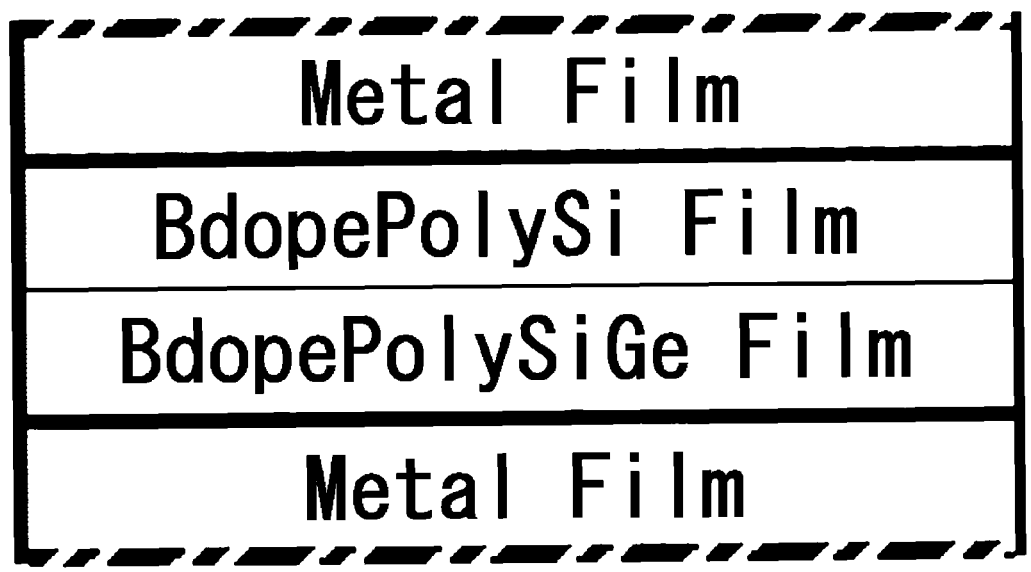
FIG. 4 is a view showing an example of the resistance film formed by the boron doped polysilicon germanium film and the boron doped polysilicon film.
Figure 5:
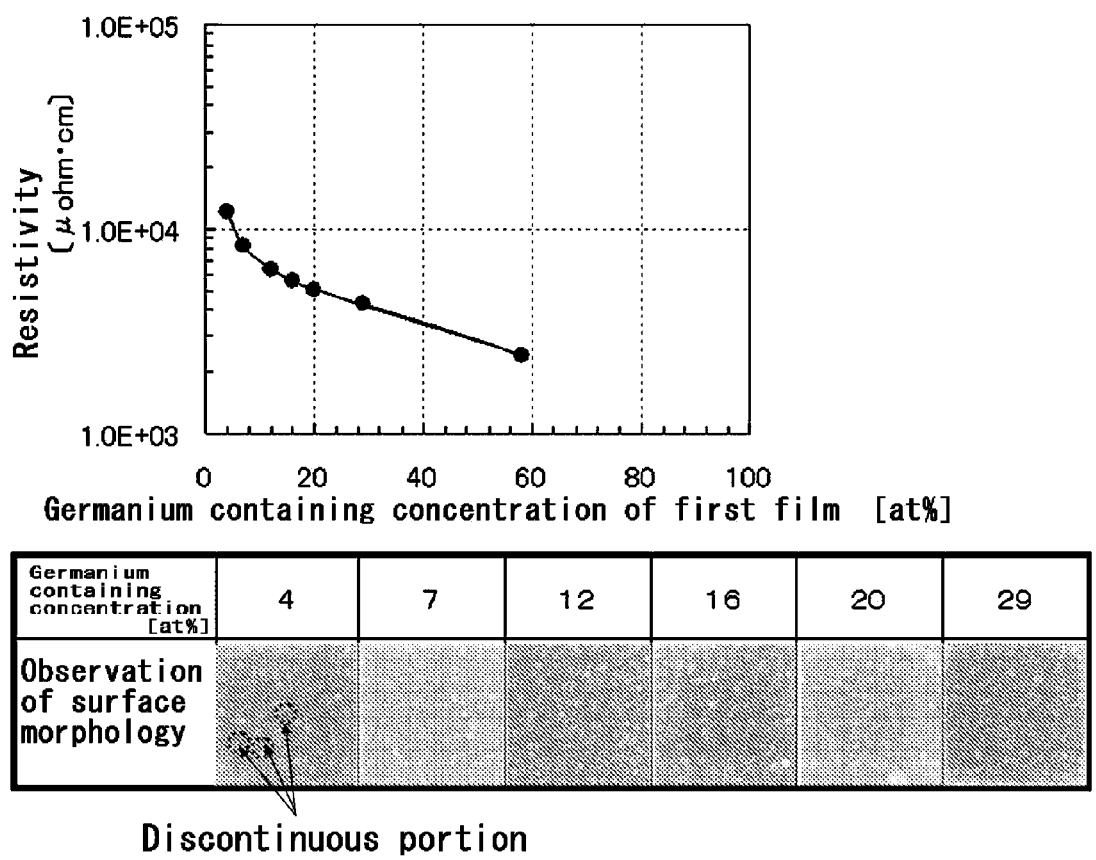
FIG. 5 is a view showing a dependency of a germanium atom-containing concentration of a first film in the resistance film formed under a first condition.
Figure 6:
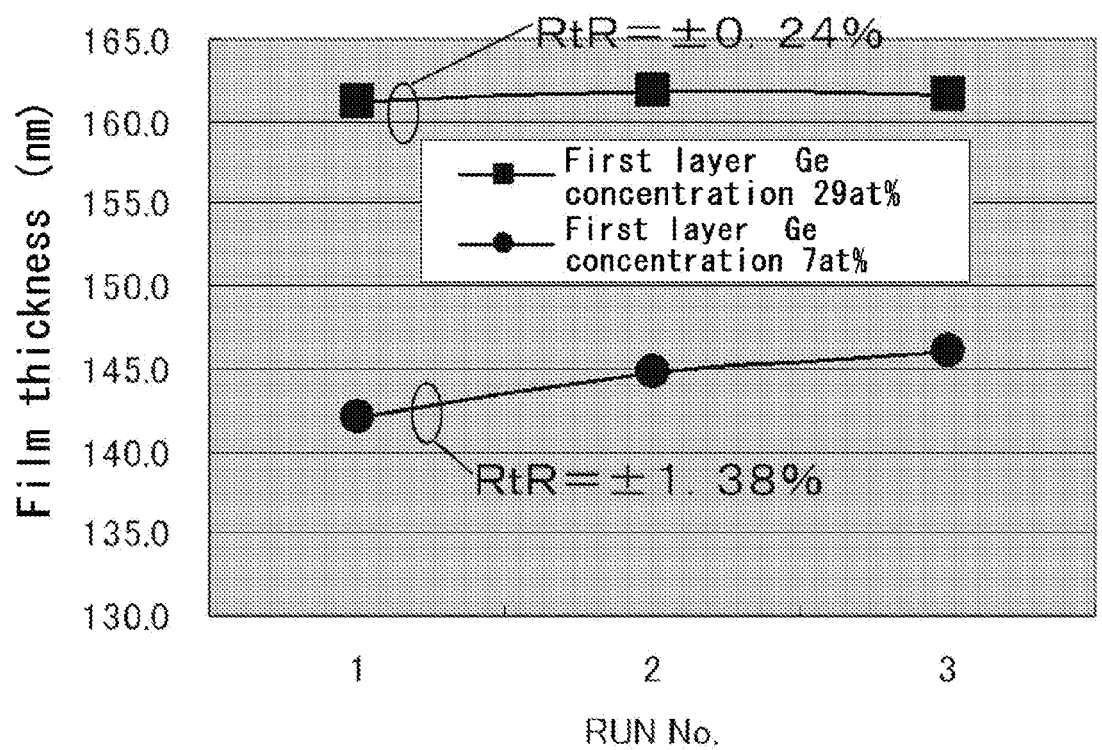
FIG. 6 is a view showing stability between continuous batches of a film thickness of the resistance film.
Figure 7:
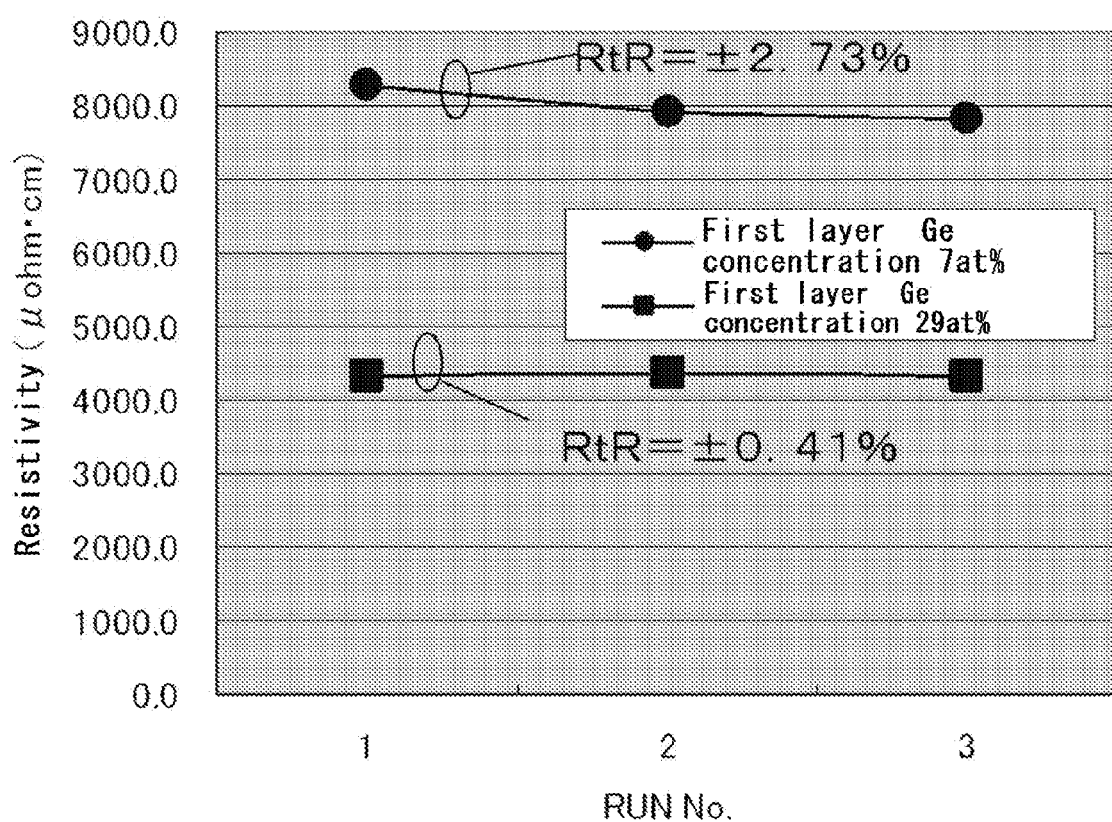
FIG. 7 is a view showing the stability between continuous bathes of the resistivity of the resistance film.
Figure 8:
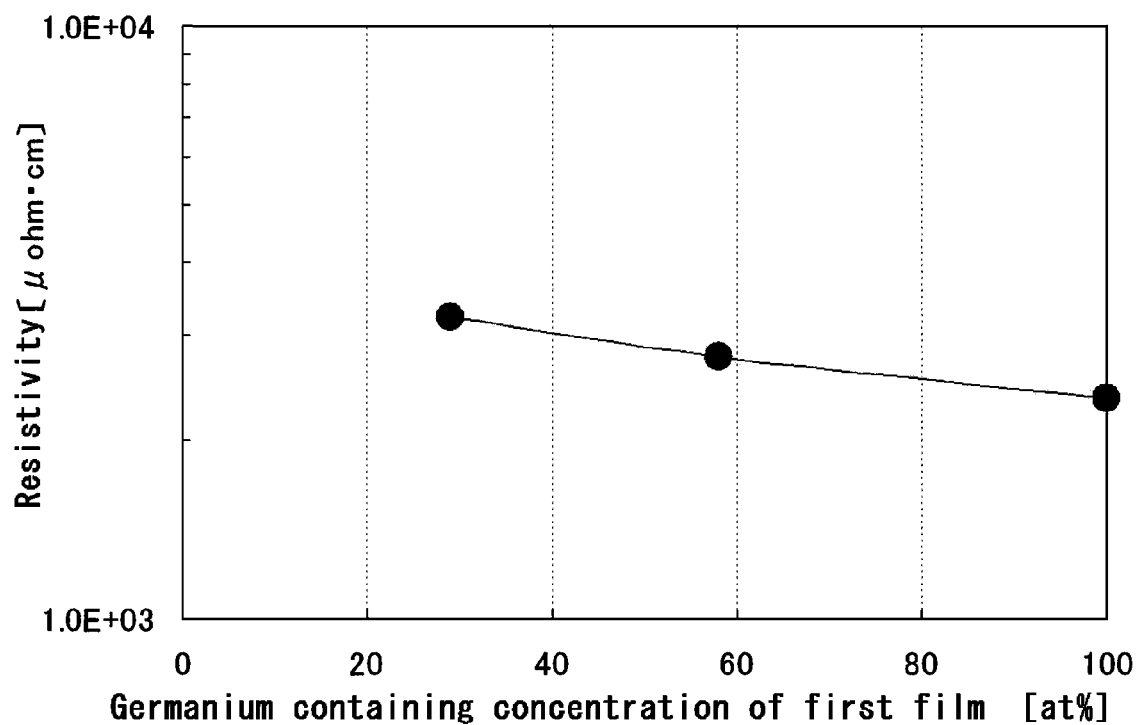
FIG. 8 is a view showing the dependency of the germanium atom-containing concentration of the first film in the resistance film formed under a second condition.
Figure 9:
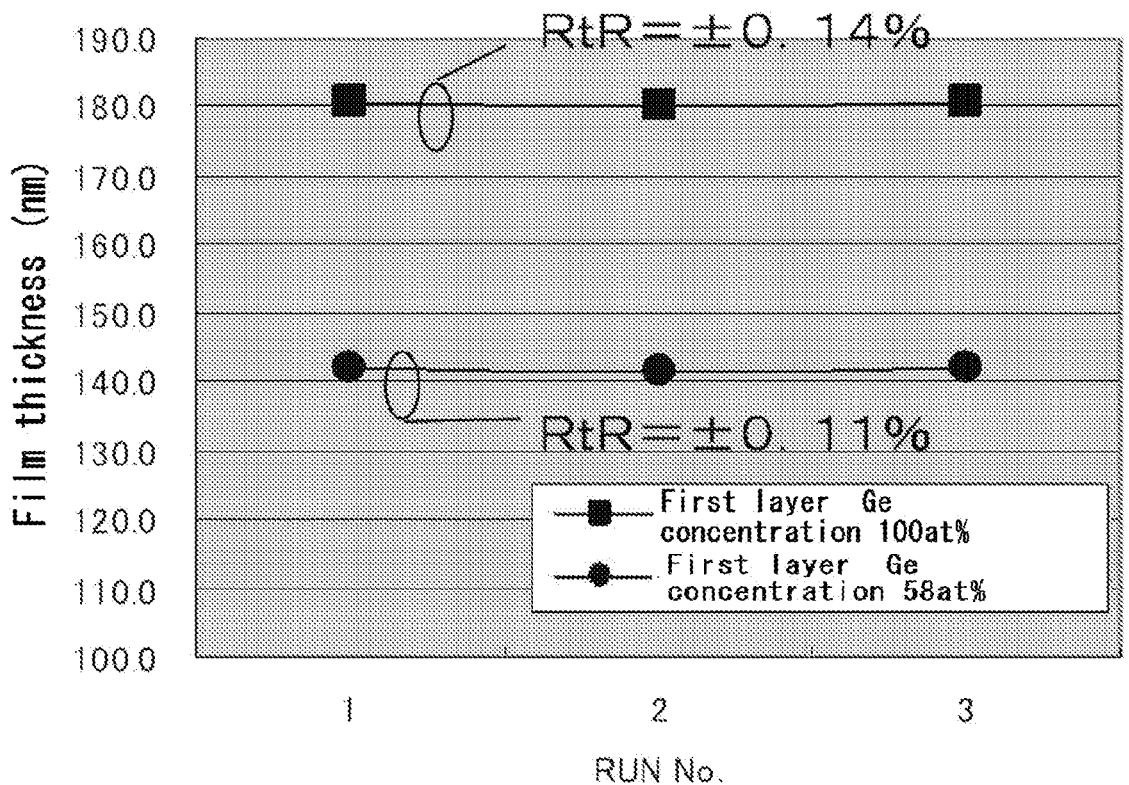
FIG. 9 is a view showing the stability between continuous batches of the film thickness of the resistance film.
Figure 10:
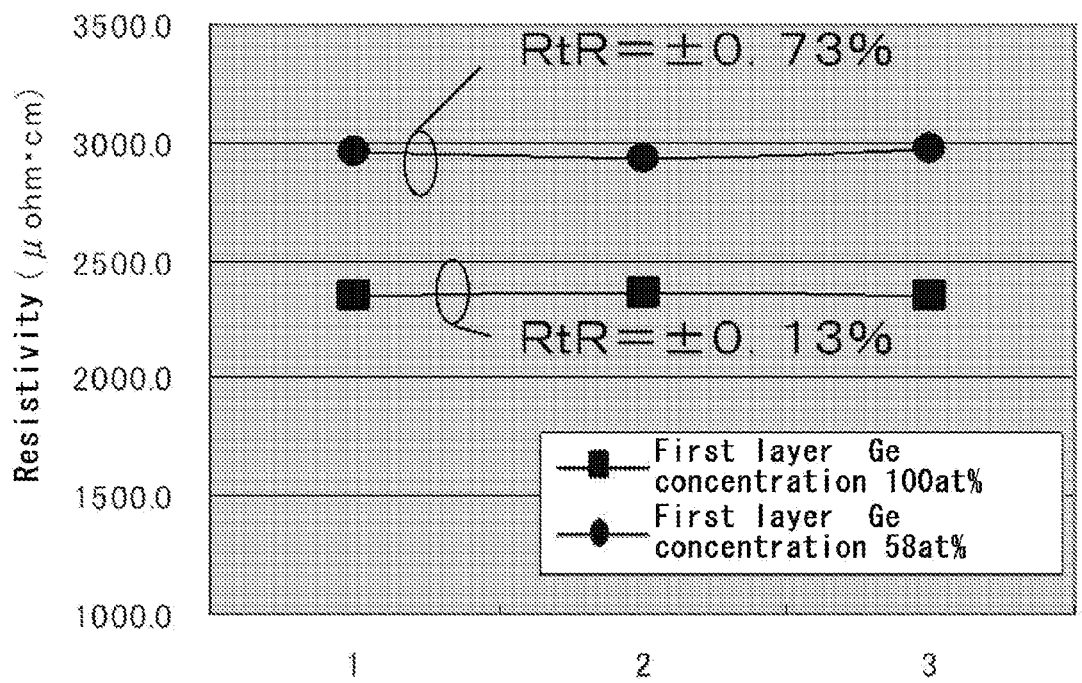
FIG. 10 is a view showing the stability between continuous batches of the resistivity of the resistance film in a case of FIG. 8.
Figure 11:
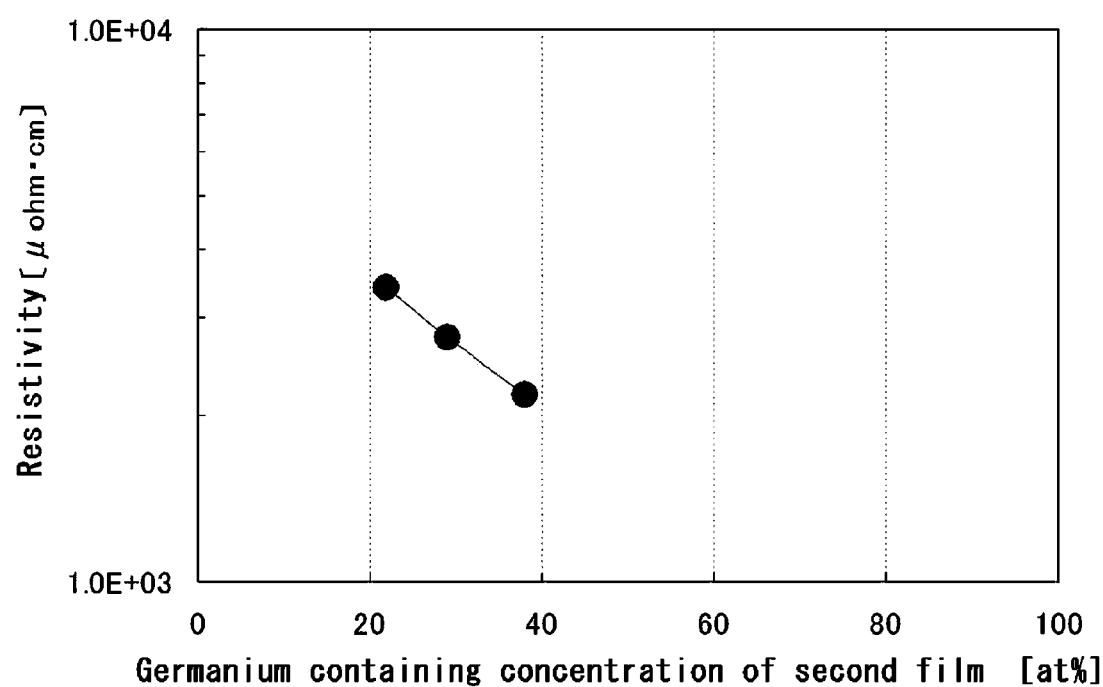
FIG. 11 is a view showing the dependency of the germanium atom-containing concentration of the second film in the resistance film formed under the second condition.
Figure 12:
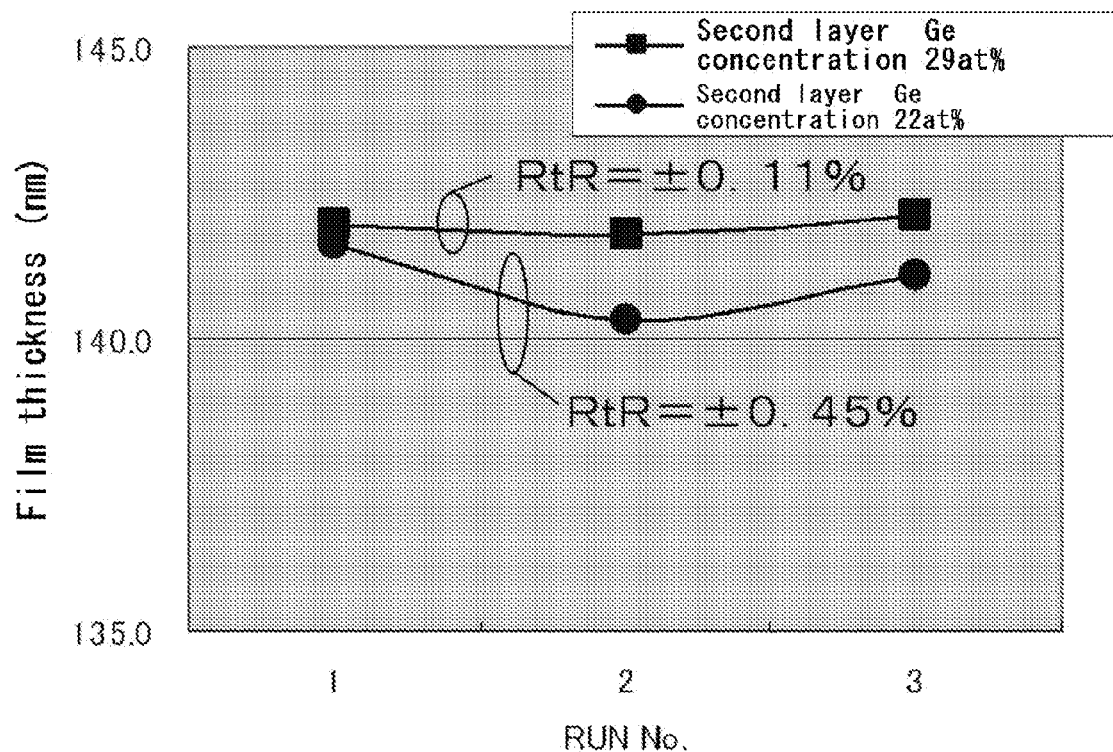
FIG. 12 is a view showing the stability between continuous batches of the film thickness of the resistance film in a case of FIG. 11.
Figure 13:
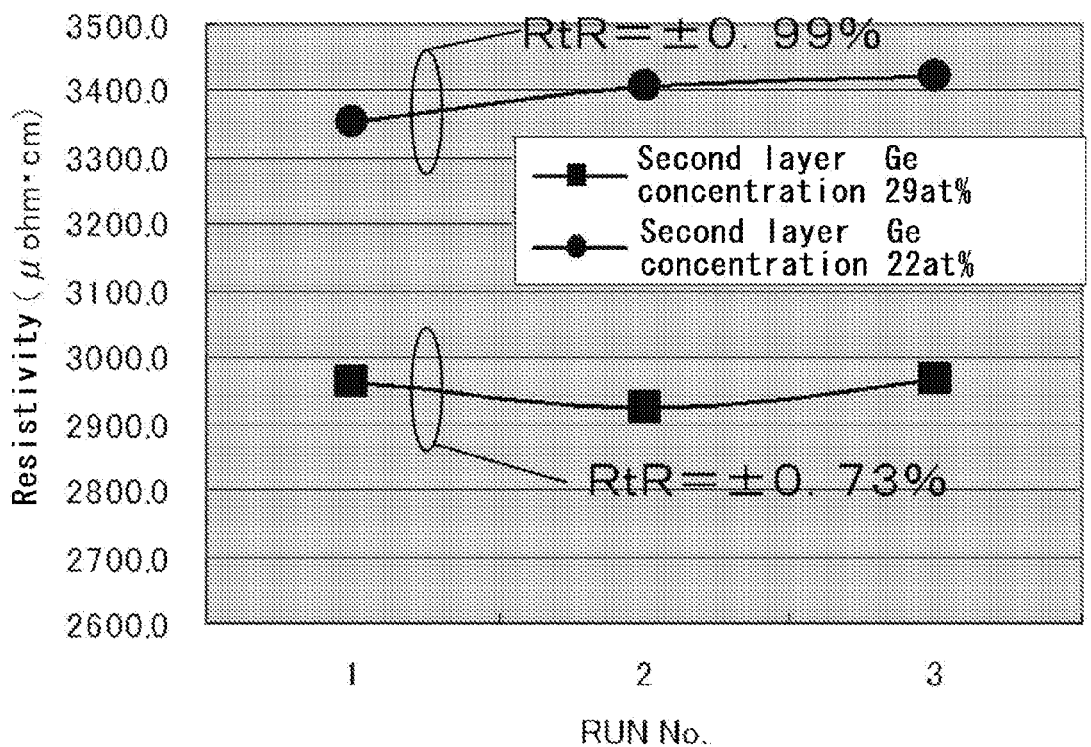
FIG. 13 is a view showing the stability between continuous batches of the resistivity of the resistance film in a case of FIG. 11.
Figure 14:
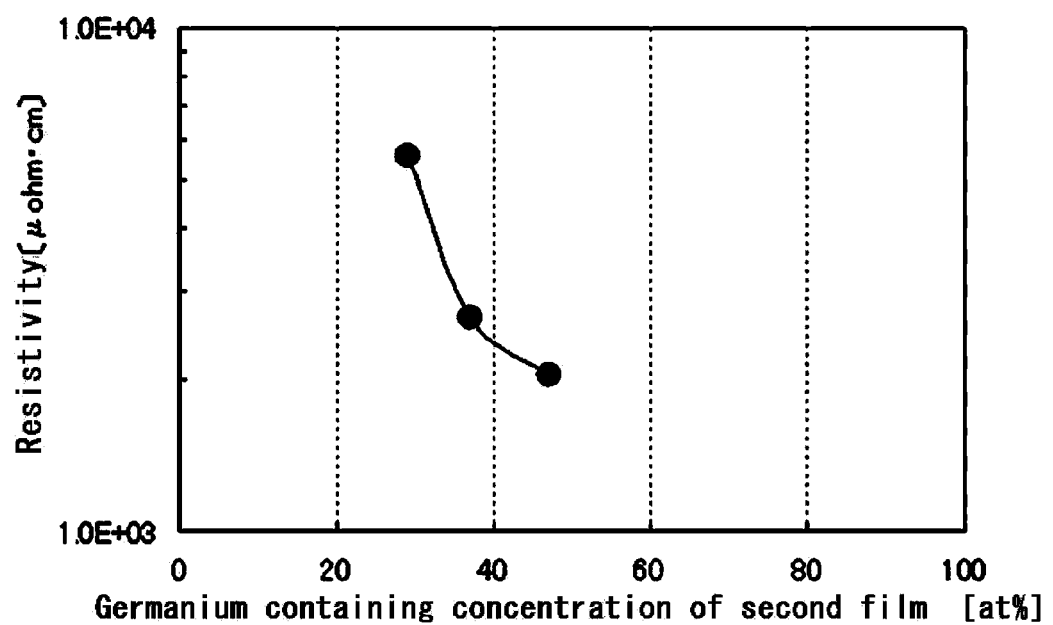
FIG. 14 is a view showing the dependency of the germanium atom-containing concentration of the second film in the FIG. 15 is a view showing the stability between continuous batches of the film thickness of the resistance film in a case of FIG. 14.
Figure 15:
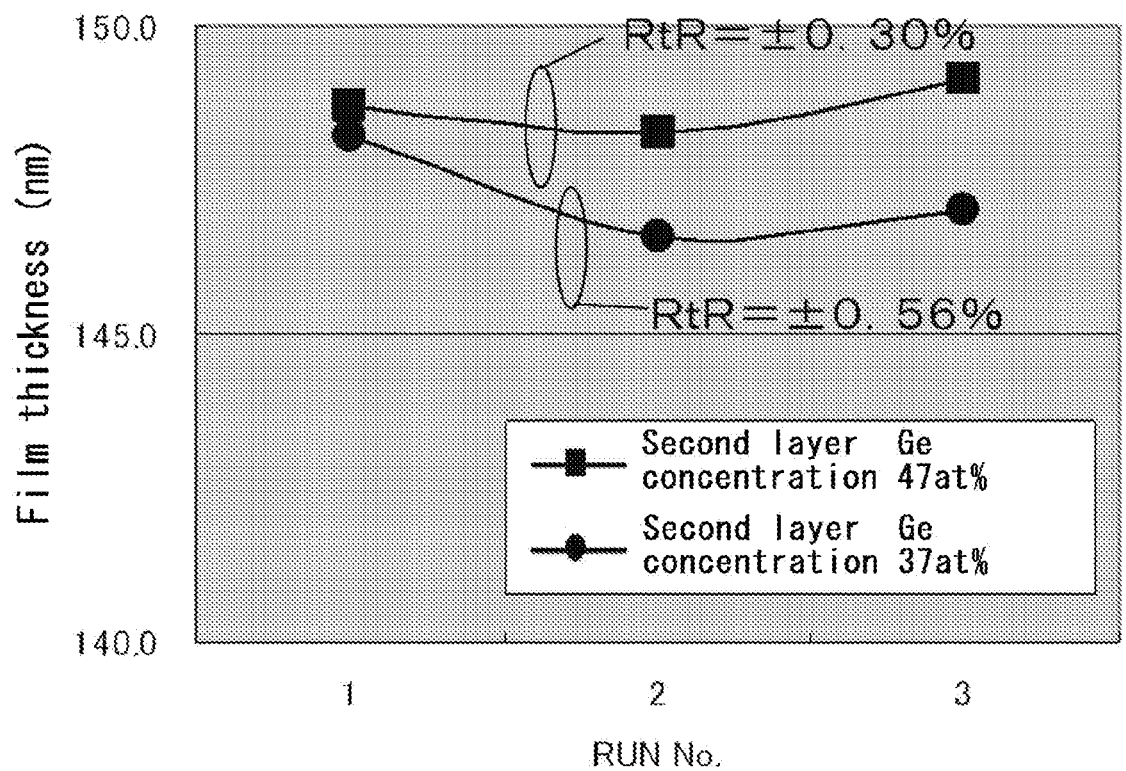
Figure 16:
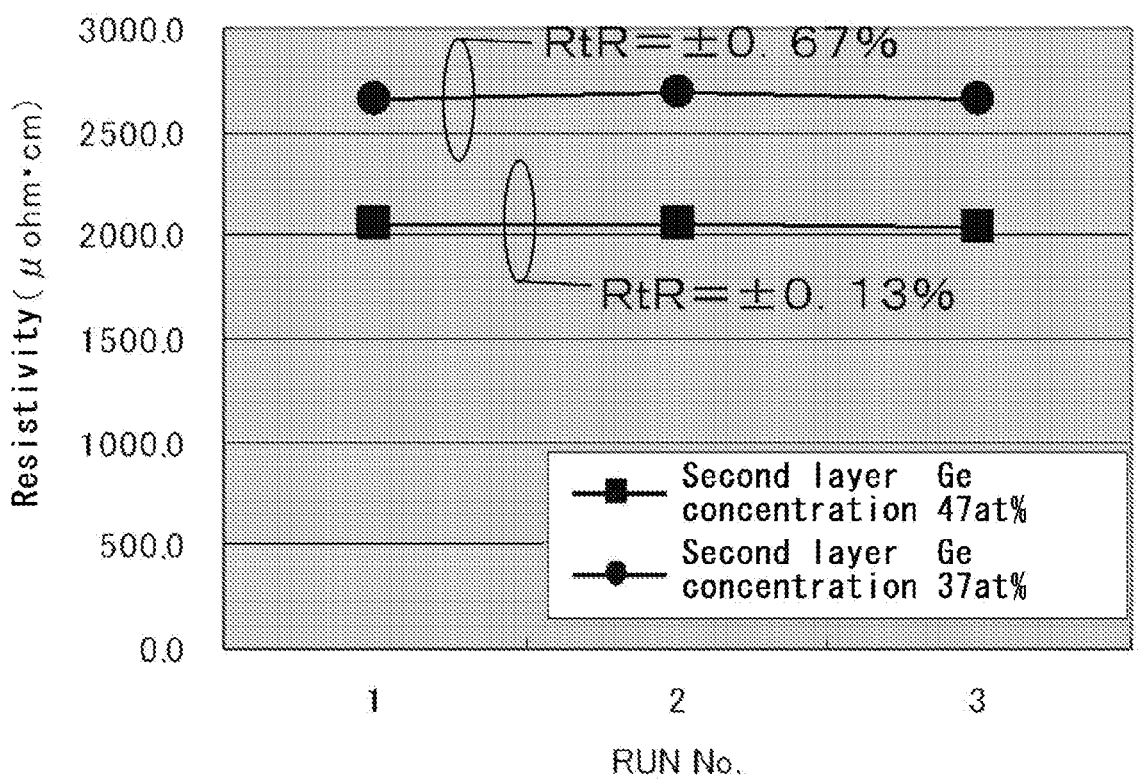
FIG. 16 is a view showing the stability between continuous batches of the resistivity of the resistance film in a case of FIG. 14.
Figure 17:
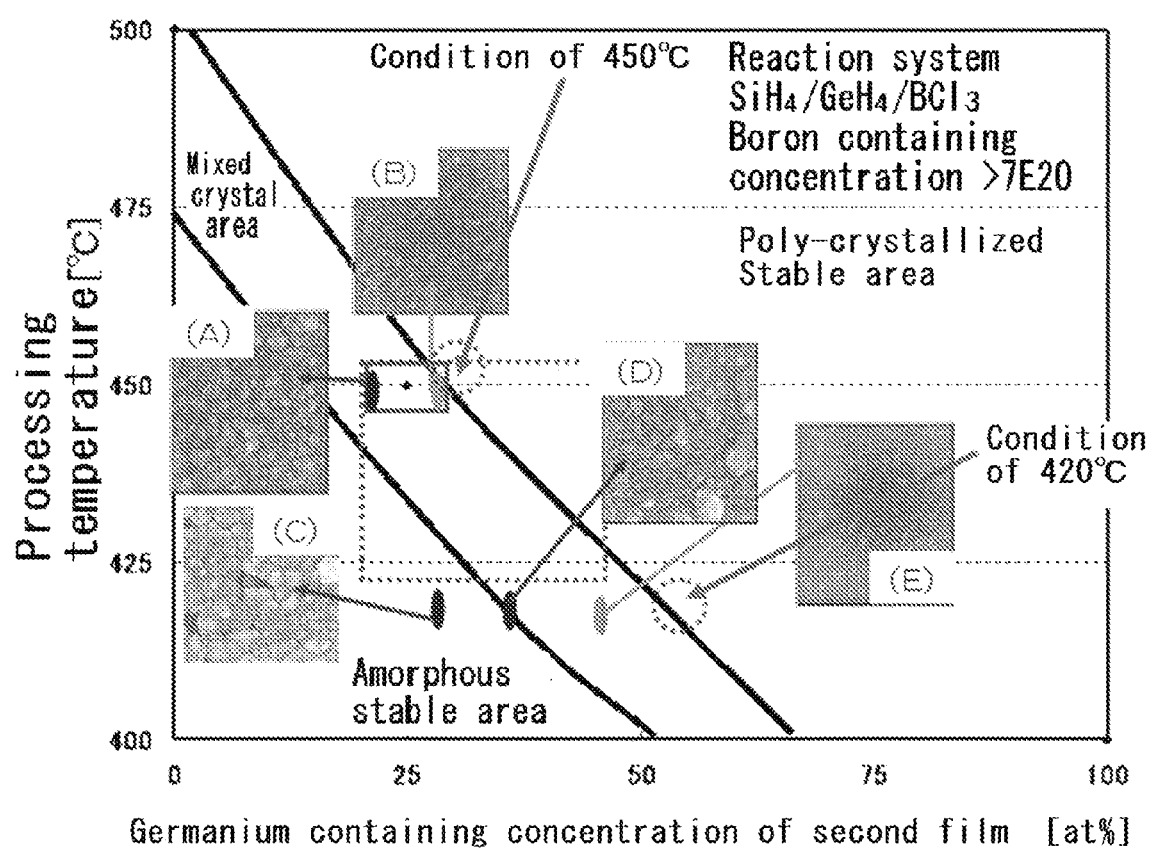
FIG. 17 is a view showing a state of a surface of the resistance film at each processing temperature.

What is claimed is:

1. A manufacturing method of a semiconductor device comprising:
   loading a substrate into a processing chamber;
   forming a first poly-crystalline film on the substrate by supplying silicon atom-containing gas, boron atom-containing gas, and germanium atom-containing gas into the processing chamber;
   forming a second poly-crystalline film on the first poly-crystalline film by supplying the silicon atom-containing gas and the boron atom-containing gas into the processing chamber; and
   unloading the substrate from the processing chamber.

2. The manufacturing method of the semiconductor device according to claim 1, wherein the first poly-crystalline film is a boron atom-containing silicon germanium film, and the second poly-crystalline film is a boron atom-containing silicon film.

3. The manufacturing method of the semiconductor device according to claim 1, wherein a germanium atomic ratio in a film of the first poly-crystalline film is 29% or more and 100% or less.

4. The manufacturing method of the semiconductor device according to claim 1, wherein in the first poly-crystalline film forming step and second poly-crystalline film forming step,
   the silicon atom-containing gas is silane gas or disilane gas or dichlorosilane gas;
   the boron atom-containing gas is Boron trichloride gas or diborane gas or Boron trifluoride gas; and
   the germanium atom-containing gas is Germane gas or digermane gas.

5. The manufacturing method of the semiconductor device according to claim 1, wherein a resistance film having a prescribed film thickness is formed by forming the first poly-crystalline film and the second poly-crystalline film, and by varying a ratio of a film thickness of the first poly-crystalline film in the resistance film, a prescribed resistance value is secured.

6. The manufacturing method of the semiconductor device according to claim 1, wherein in the first poly-crystalline film forming step and the second poly-crystalline film forming step, substrate temperatures are 380° C. or more and 480° C. or less, and the first poly-crystalline film forming step and the second poly-crystalline film forming step are performed in a state that the substrate temperatures are controlled to be the same temperatures.

7. The manufacturing method of the semiconductor device according to claim 1 further comprising:
   forming a metal film on the second poly-crystalline film.

8. The manufacturing method of the semiconductor device, comprising:
   loading a substrate into a processing chamber;
   forming a first poly-crystalline film on the substrate by supplying silicon atom-containing gas, boron atom-containing gas, and germanium atom-containing gas into the processing chamber;
   forming a second poly-crystalline film on the first poly-crystalline film, having a smaller germanium atomic ratio than that of the first poly-crystalline film, by supplying the silicon atom-containing gas, the boron atom-containing gas, and the germanium atom-containing gas into the processing chamber; and
   unloading the substrate from the processing chamber.

9. The manufacturing method of the semiconductor device according to claim 8 further comprising:
   forming a metal film on the second poly-crystalline film.

10. A substrate processing method, comprising:
    loading a substrate into a processing chamber;
    forming a first poly-crystalline film on the substrate by supplying silicon atom-containing gas, boron atom-containing gas, and germanium atom-containing gas into the processing chamber;
    forming a second poly-crystalline film on the first poly-crystalline film by supplying the silicon atom-containing gas and the boron atom-containing gas into the processing chamber; and
    unloading the substrate from the processing chamber.

11. The substrate processing method according to claim 10, wherein the first poly-crystalline film is a boron atom-containing silicon germanium film, and the second poly-crystalline film is a boron atom-containing silicon germanium film having smaller germanium atomic ratio than that of the first poly-crystalline film.

12. The substrate processing method according to claim 10, wherein a germanium atomic ratio in a film of the second poly-crystalline film is 22% or more and 58% or less, and the germanium atomic ratio in the film of the second poly-crystalline film is smaller than the germanium atomic ratio in the film of the first poly-crystalline film.

13. The substrate processing method according to claim 10, wherein in the first poly-crystalline film forming step and second poly-crystalline film forming step,
    the silicon atom-containing gas is silane gas or disilane gas or dichlorosilane gas;
    the boron atom-containing gas is Boron trichloride gas or diborane gas or Boron trifluoride gas; and
    the germanium atom-containing gas is Germane gas or digermane gas.

14. The substrate processing method according to claim 10, wherein a resistance film having a prescribed film thickness is formed by forming the first poly-crystalline film and the second poly-crystalline film, and by varying a ratio of the film thickness of the first poly-crystalline film in the resistance film, a prescribed resistance value is secured.

15. The substrate processing method according to claim 10, wherein in the first poly-crystalline film forming step and the second poly-crystalline film forming step, a temperature of the substrate is 380° C. or more and 480° C. or less, and the steps are performed in a state that the temperature of the substrate is controlled to be the same temperature.

16. The substrate processing method according to claim 10 further comprising:
    forming a metal film on the second poly-crystalline film.

17. A substrate processing method, comprising:
    loading a substrate into a processing chamber;
    forming a first poly-crystalline film on the substrate by supplying silicon atom-containing gas, boron atom-containing gas, and germanium atom-containing gas into the processing chamber;
    forming a second poly-crystalline film on the first poly-crystalline film, having a smaller germanium atomic ratio than that of the first poly-crystalline film, by supplying the silicon atom-containing gas, the boron atom-containing gas, and the germanium atom-containing gas into the processing chamber; and unloading the substrate from the processing chamber.

18. The substrate processing method according to claim 17 further comprising:

forming a metal film on the second poly-crystalline film.

19. A film forming method, comprising:

loading a substrate into a processing chamber;

forming a first poly-crystalline film on the substrate by supplying silicon atom-containing gas, boron atom-containing gas, and germanium atom-containing gas into the processing chamber;

forming a second poly-crystalline film on the first poly-crystalline film, by supplying the silicon atom-containing gas and the boron atom-containing gas into the processing chamber; and unloading the substrate from the processing chamber.

20. The film forming method according to claim 19 further comprising:

forming a metal film on the second poly-crystalline film.

* * * * *